(12) United States Patent
Hwang et al.

(10) Patent No.: US 11,749,586 B2
(45) Date of Patent: Sep. 5, 2023

(54) SEMICONDUCTOR DEVICE INCLUDING THROUGH VIA STRUCTURE

(71) Applicant: Samsung Electronics Co., Ltd., Suwon-si (KR)

(72) Inventors: Sonkwan Hwang, Suwon-si (KR); Taeseong Kim, Suwon-si (KR); Hoonjoo Na, Seoul (KR); Kwangjin Moon, Hwaseong-si (KR); Hyungjun Jeon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 110 days.

(21) Appl. No.: 17/514,218

(22) Filed: Oct. 29, 2021

(65) Prior Publication Data

US 2022/0310485 A1    Sep. 29, 2022

(30) Foreign Application Priority Data

Mar. 24, 2021    (KR) ........................ 10-2021-0038273

(51) Int. Cl.
  *H01L 21/00*    (2006.01)
  *H01L 23/48*    (2006.01)
  (Continued)

(52) U.S. Cl.
  CPC ...... *H01L 23/481* (2013.01); *H01L 21/76898* (2013.01); *H01L 23/528* (2013.01);
  (Continued)

(58) Field of Classification Search
  CPC ............. H01L 23/481; H01L 21/76898; H01L 23/528
  See application file for complete search history.

(56) References Cited

U.S. PATENT DOCUMENTS 7,973,413 B2 *   7/2011   Kuo ...................... H01L 23/481
                                                          257/706
8,487,425 B2 *   7/2013   Andry ............... H01L 21/76846
                                                          257/773
(Continued)

FOREIGN PATENT DOCUMENTS

CN           115132698 A    *   9/2022   ....... H01L 21/76898
KR      10-2014-0014251 A       2/2014
(Continued)

*Primary Examiner* — Laura M Menz
(74) *Attorney, Agent, or Firm* — Harness, Dickey & Pierce, P.L.C.

(57) ABSTRACT

A semiconductor device including a semiconductor substrate, an integrated circuit layer on the semiconductor substrate, first to $n^{th}$ metal wiring layers (where n is a positive integer) sequentially stacked on the semiconductor substrate and the integrated circuit layer, a first through via structure extending in a vertical direction toward the semiconductor substrate from a first via connection metal wiring layer, which is one of the second to $n^{th}$ metal wiring layers other than the first metal wiring layer, and passing through the semiconductor substrate, and a second through via structure being apart from the first through via structure, extending in a vertical direction toward the semiconductor substrate from a second via connection metal wiring layer, which is one of the second to $n^{th}$ metal wiring layers other than the first metal wiring layer, and passing through the semiconductor substrate may be provided.

20 Claims, 23 Drawing Sheets

(51) Int. Cl.
*H01L 27/088* (2006.01)
*H01L 25/065* (2023.01)
*H01L 21/768* (2006.01)
*H01L 23/528* (2006.01)
*H01L 23/00* (2006.01)

(52) U.S. Cl.
CPC ...... *H01L 25/0657* (2013.01); *H01L 27/0886* (2013.01); *H01L 24/02* (2013.01); *H01L 24/05* (2013.01); *H01L 24/06* (2013.01); *H01L 2224/02381* (2013.01); *H01L 2224/0401* (2013.01); *H01L 2224/0557* (2013.01); *H01L 2224/05569* (2013.01); *H01L 2224/0603* (2013.01); *H01L 2224/06181* (2013.01); *H01L 2225/06513* (2013.01); *H01L 2225/06544* (2013.01)

(56) References Cited

U.S. PATENT DOCUMENTS

| | | | |
|---|---|---|---|
| 8,487,444 B2 * | 7/2013 | Law | H01L 23/481 257/777 |
| 8,492,878 B2 * | 7/2013 | Farooq | H01L 21/76898 257/E21.597 |
| 8,791,554 B2 * | 7/2014 | Kwak | H01L 23/49827 257/659 |
| 8,884,427 B2 | 11/2014 | Woychik et al. | |
| 9,142,490 B2 * | 9/2015 | Park | H01L 21/76898 |
| 9,312,171 B2 * | 4/2016 | Han | H01L 21/76879 |
| 9,634,053 B2 | 4/2017 | Huang et al. | |
| 9,812,490 B2 * | 11/2017 | Itonaga | H01L 27/14687 |
| 9,824,973 B2 * | 11/2017 | Lee | H01L 23/481 |
| 10,074,630 B2 | 9/2018 | Kelly et al. | |
| 11,041,211 B2 | 6/2021 | Jain | |
| 2010/0244251 A1 * | 9/2010 | Torazawa | H01L 21/76805 438/109 |
| 2012/0043665 A1 * | 2/2012 | Nakano | H01L 23/481 257/774 |
| 2020/0273780 A1 * | 8/2020 | Park | H01L 23/481 |
| 2022/0037307 A1 * | 2/2022 | Lee | H01L 27/0207 |
| 2022/0139806 A1 * | 5/2022 | Park | H01L 23/5283 257/621 |
| 2022/0310485 A1 * | 9/2022 | Hwang | H01L 23/522 |
| 2022/0336326 A1 * | 10/2022 | Ding | H01L 23/481 |
| 2023/0005818 A1 * | 1/2023 | Lee | H01L 27/105 |

FOREIGN PATENT DOCUMENTS

| | | |
|---|---|---|
| KR | 10-2014-0038195 A | 3/2014 |
| KR | 10-2016-0122670 A | 10/2016 |
| KR | 10-2017-0021070 A | 2/2017 |
| KR | 10-1782224 B1 | 9/2017 |
| KR | 10-2037114 B1 | 10/2019 |
| KR | 10-2151177 B1 | 9/2020 |
| KR | 10-2020-0124693 A | 11/2020 |

\* cited by examiner

SEMICONDUCTOR DEVICE INCLUDING THROUGH VIA STRUCTURE

CROSS-REFERENCE TO RELATED APPLICATION

This application is based on and claims priority under 35 U.S.C. § 119 to Korean Patent Application No. 10-2021-0038273, filed on Mar. 24, 2021, in the Korean Intellectual Property Office, the disclosure of which is incorporated by reference herein in its entirety.

BACKGROUND

The inventive concepts relate to semiconductor devices, and more particularly, to semiconductor devices including a through via structure.

As the amount of data processed by electronic devices increases, semiconductor devices having a high capacity and a high bandwidth are needed. To this end, technology using, as a through electrode, a through via structure (e.g., a through silicon via (TSV) structure) implemented by forming a fine hole in a semiconductor device has been proposed.

In a case where a through via structure is used as an electrode, the through via structure needs to adjust a resistance. Also, in a case where an integrated circuit layer (e.g., transistors) is disposed near a through via structure, the through via structure has to mitigate or prevent the electrical performance of the integrated circuit layer (e.g., the transistors) from being reduced.

SUMMARY

The inventive concepts provide semiconductor devices including a through via structure, which may adjust a resistance and mitigate or prevent the electrical performance of a peripheral integrated circuit layer from being reduced.

According to an aspect of the inventive concepts, a semiconductor device includes a semiconductor substrate, an integrated circuit layer on the semiconductor substrate, first to $n^{th}$ metal wiring layers (where n is a positive integer) sequentially stacked on the semiconductor substrate and the integrated circuit layer, a first through via structure extending in a vertical direction toward the semiconductor substrate from a first via connection metal wiring layer, and passing through the semiconductor substrate, the first via connection metal wiring layer being one of the second to $n^{th}$ metal wiring layers other than the first metal wiring layer, and a second through via structure being apart from the first through via structure, extending in a vertical direction toward the semiconductor substrate from a second via connection metal wiring layer, and passing through the semiconductor substrate, the second via connection metal wiring layer being one of the second to $n^{th}$ metal wiring layers other than the first metal wiring layer.

According to another aspect of the inventive concepts, a semiconductor device includes a semiconductor substrate including a first surface and a second surface opposite to the first surface, a front end level layer on the first surface of the semiconductor substrate, the front end level layer including an integrated circuit layer, a back end level layer on the front end level layer, the back end level layer including first to $n^{th}$ metal wiring layers (where n is a positive integer) sequentially stacked on the integrated circuit layer and electrically connected to the integrated circuit layer, a first through via structure extending in a vertical direction toward the semiconductor substrate from a first via connection metal wiring layer, and passing through the back end level layer, the front end level layer, and a region between the first surface and the second surface of the semiconductor substrate, the first via connection metal wiring layer being one of the second to $n^{th}$ metal wiring layers other than the first metal wiring layer, and a second through via structure being apart from the first through via structure, extending in a vertical direction toward the semiconductor substrate from a second via connection metal wiring layer, and passing through the back end level layer, the front end level layer, and the region between the first surface and the second surface of the semiconductor substrate, the second via connection metal wiring layer being one of the second to $n^{th}$ metal wiring layers other than the first metal wiring layer.

According to another aspect of the inventive concepts, a semiconductor device includes a semiconductor substrate, a front end level layer on the semiconductor substrate, the front end level layer including an integrated circuit layer, an interlayer insulation layer configured to insulate the integrated circuit layer, and a contact plug layer in the interlayer insulation layer and electrically connected to the integrated circuit layer, a back end level layer on the front end level layer, the back end level layer including first to $n^{th}$ metal wiring layers (where n is a positive integer) sequentially stacked on the front end level layer and electrically connected to the integrated circuit layer, a plurality of wiring insulation layers configured to insulate the first to $n^{th}$ metal wiring layers from each other, and a plurality of wiring via layers in the plurality of wiring insulation layers and configured to connect the first to $n^{th}$ metal wiring layers, a first through via structure extending in a vertical direction toward the semiconductor substrate from a first via connection metal wiring layer, and passing through the plurality of wiring insulation layers, the interlayer insulation layer, and the semiconductor substrate, the first via connection metal wiring layer being one of the second to $n^{th}$ metal wiring layers other than the first metal wiring layer, and a second through via structure being apart from the first through via structure, extending in a vertical direction toward the semiconductor substrate from a second via connection metal wiring layer, and passing through the plurality of wiring insulation layers, the interlayer insulation layer, and the semiconductor substrate, the second via connection metal wiring layer being one of the second to $n^{th}$ metal wiring layers other than the first metal wiring layer, wherein the first through via structure is in a first keep-out zone at one side of the integrated circuit layer, and the second through via structure is in a second keep-out zone at an other side of the integrated circuit layer.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION

Hereinafter, some example embodiments will be described in detail with reference to the accompanying drawings. The following example embodiments may be implemented as separate example embodiments, or may be implemented by a combination of two or more example embodiments. Therefore, it is not construed that the inventive concepts are limited to the disclosed embodiments.

As used herein, the singular forms "a", "an" and "the" are intended to include the plural forms as well, unless the context clearly indicates otherwise. Herein, the drawings are exaggerated and illustrated for clearly describing embodiments.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
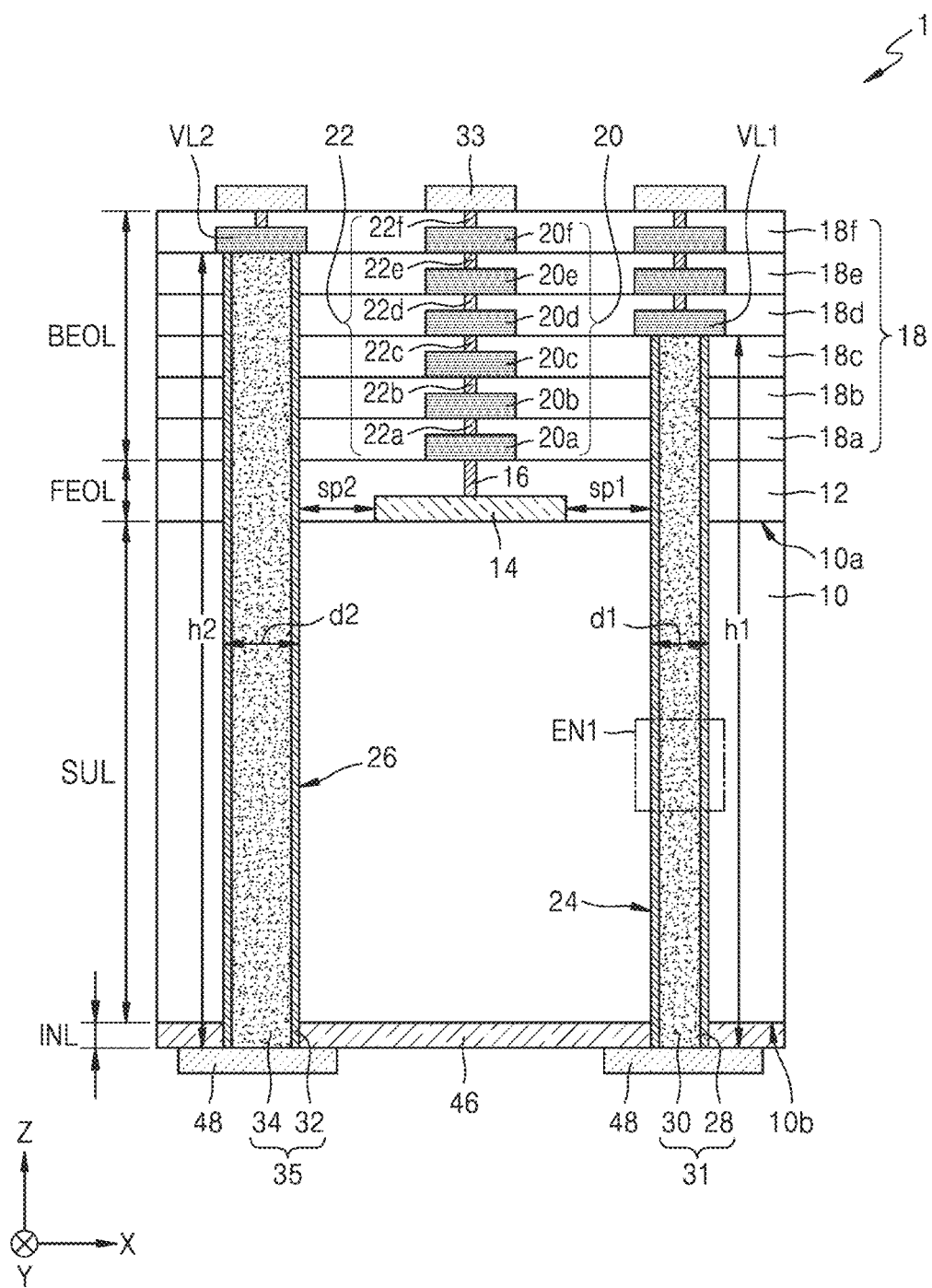
FIG. 1 is a cross-sectional view for describing a semiconductor device according to an example embodiment.
Figure 2:
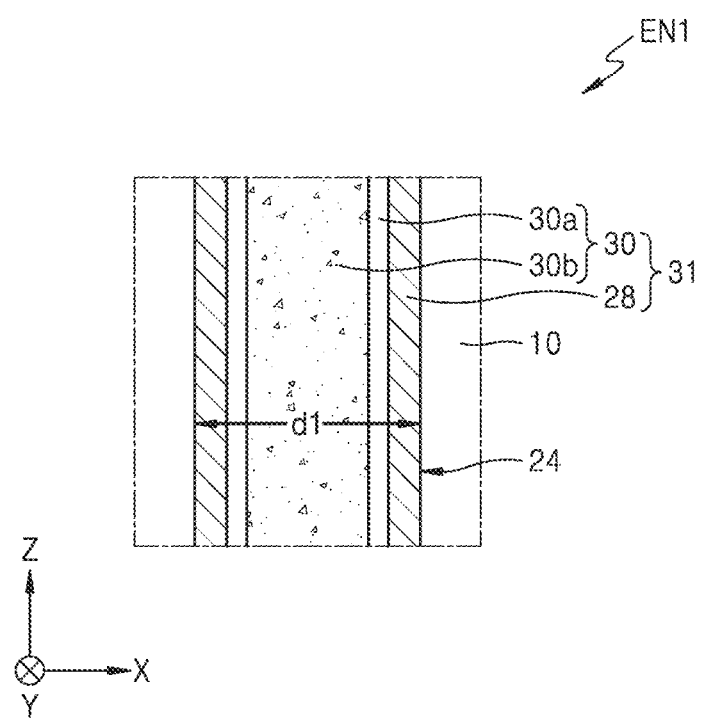
FIG. 2 is an enlarged view of a region EN1 of FIG. 1.
Figure 3:
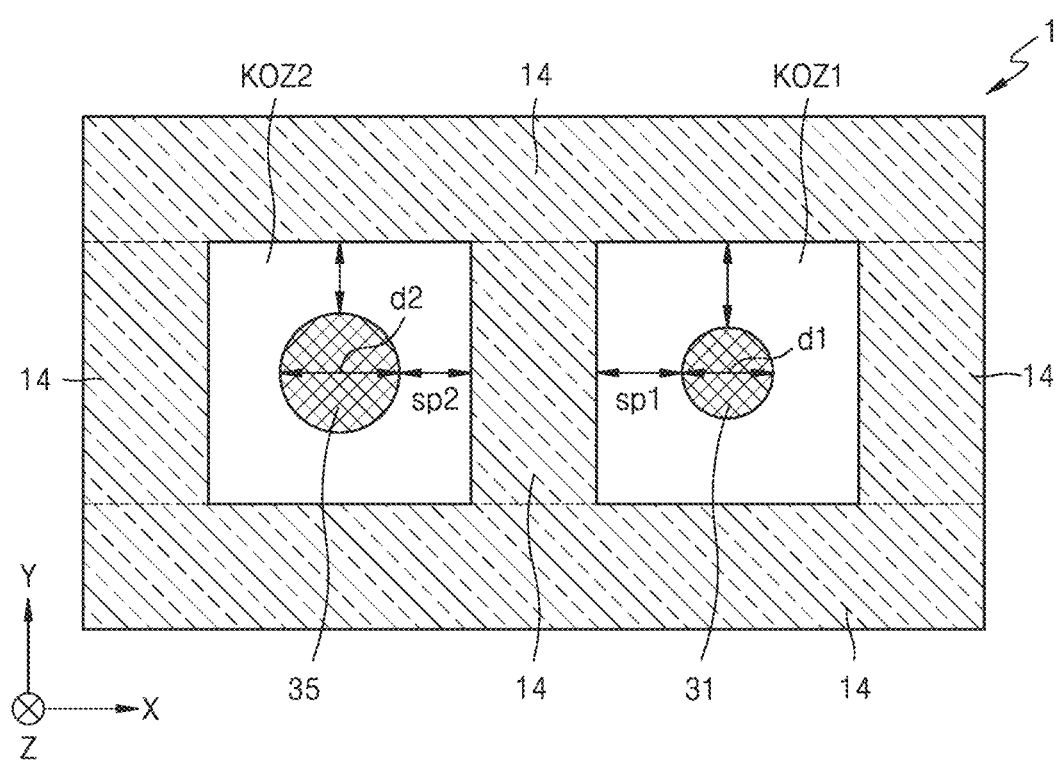
FIG. 3 is a plan view for describing an arrangement relationship between an integrated circuit layer and through via structures of FIG. 1.

FIG. 1 is a cross-sectional view for describing a semiconductor device 1 according to an example embodiment, FIG. 2 is an enlarged view of a region EN1 of FIG. 1, and FIG. 3 is a plan view for describing an arrangement relationship between an integrated circuit layer and through via structures of FIG. 1.

For example, the semiconductor device 1 may include a semiconductor substrate 10. The semiconductor substrate 10 may configure a substrate level layer SUL. The semiconductor substrate 10 may be configured with a semiconductor wafer. The semiconductor substrate 10 may include Group IV materials or Group III-V compounds. The semiconductor substrate 10 may be configured with a single crystalline wafer (e.g., a silicon crystalline wafer).

The semiconductor substrate 10 is not limited to a single crystalline wafer and may include various wafers such as an epi or epitaxial wafer, a polished wafer, an annealed wafer, and a silicon on insulator (SOI) wafer. The epitaxial wafer may denote a wafer where a crystalline material is grown on a single crystalline silicon substrate. The semiconductor substrate 10 may include a silicon substrate. The semiconductor substrate 10 may include a first surface 10a and a second surface 10b opposite to the first surface 10a.

The semiconductor device 1 may include an integrated circuit layer 14. The integrated circuit layer 14 may be formed on the first surface 10a of the semiconductor substrate 10. The integrated circuit layer 14 may include a plurality of circuit elements (e.g., transistors, capacitors, and/or registers). Based on a structure of the integrated circuit layer 14, the semiconductor device 1 may function as a memory device or a logic device. For example, the memory device may include dynamic random access memory (DRAM), static random access memory (SRAM), flash memory, electrically erasable programmable read-only memory (EEPROM), phase change random access memory (PRAM), magnetic random access memory (MRAM), or resistance random access memory (RRAM). A structure of the integrated circuit layer 14 is commonly known and does not limit the inventive concepts.

A first lower portion, where the integrated circuit layer 14 is formed, of the first surface 10a of the semiconductor substrate 10 may be an active region, and a second lower portion, where the integrated circuit layer 14 is not formed, of the first surface 10a of the semiconductor substrate 10 may be a non-active region. An impurity doping region (e.g., a source and drain region and a well region) formed under the first surface 10a of the semiconductor substrate 10 is not illustrated in FIG. 1 for convenience. An isolation region formed under the first surface 10a of the semiconductor substrate 10 is not illustrated in FIG. 1 for convenience.

An interlayer insulation layer 12 may be formed on the semiconductor substrate 10 and the integrated circuit layer 14. The interlayer insulation layer 12 may include a silicon oxide layer. A contact plug layer 16 electrically connected to the integrated circuit layer 14 may be formed in the interlayer insulation layer 12. The contact plug layer 16 may include a metal layer (e.g., a tungsten layer).

The integrated circuit layer 14, the interlayer insulation layer 12, and the contact plug layer 16 each formed on the semiconductor layer 10 may configure a front end level layer FEOL. The front end level layer FEOL may be referred to as a front end of line, in terms of a manufacturing process.

The semiconductor device 1 may include a plurality of metal wiring layers 20. The metal wiring layers 20 may include a metal layer (e.g., a copper layer, an aluminum layer, or a tungsten layer). The metal wiring layers 20 sequentially and electrically connected to one another may be formed on the semiconductor substrate 10 and the integrated circuit layer 14. The metal wiring layers 20 may include a first metal wiring layer 20a, a second metal wiring layer 20b, a third metal wiring layer 20c, a fourth metal wiring layer 20d, a fifth metal wiring layer 20e, and a sixth metal wiring layer 20f. The sixth metal wiring layer 20f may be an uppermost metal wiring layer.

In an example embodiment, for convenience, only the first to sixth metal wiring layers 20 are illustrated, but first to $n^{th}$ (where n is a positive integer) metal wiring layers may be formed on the semiconductor substrate 10 and the integrated circuit layer 14. Here, the $n^{th}$ metal wiring layer may be an uppermost metal wiring layer. In some example embodiments, in the first to $n^{th}$ metal wiring layers, n may be a positive integer of 30 or less.

The semiconductor device 1 may include a plurality of wiring insulation layers 18. The wiring insulation layers 18 may insulate the first to sixth metal wiring layers 20. The wiring insulation layers 18 may include a silicon oxide layer. The wiring insulation layers 18 may include a first wiring insulation layer 18a, a second wiring insulation layer 18b, a third wiring insulation layer 18c, a fourth wiring insulation layer 18d, a fifth wiring insulation layer 18e, and a sixth wiring insulation layer 18f.

The semiconductor device 1 may include a plurality of wiring via layers 22. The wiring via layers 22 may electrically connect the metal wiring layers 20 to each other. The wiring via layers 22 may include a metal layer (e.g., a copper layer, an aluminum layer, or a tungsten layer). The wiring via layers 22 may include a first wiring via layer 22a, a second wiring via layer 22b, a third wiring via layer 22c, a fourth wiring via layer 22d, a fifth wiring via layer 22e, and a sixth wiring via layer 22f.

The metal wiring layers 20, the wiring insulation layers 18, and the wiring via layers 22 each formed on the front end level layer FEOL may configure a back end level layer BEOL. The back end level layer BEOL may be referred to as a back end of line, in terms of a manufacturing process.

The semiconductor device 1 may include a first through via structure 31. The first through via structure 31 may include a first through silicon via (TSV) structure. The first through via structure 31 may include a signal transfer via structure or a power transfer via structure. The first through via structure 31 may be disposed apart from one side of the integrated circuit layer 14 by a first separation distance sp1. In some example embodiments, the first separation distance sp1 may be several um to tens um. In some example embodiments, the first separation distance sp1 may be about 1 um to about 20 um.

The first through via structure 31 may have a first diameter d1. The first diameter d1 may be a first critical dimension CD1. In some example embodiments, the first diameter d1 may be several um to tens um. In some example embodiments, the first diameter d1 may be about 1 um to about 15 um.

The first through via structure 31 may extend in a vertical direction toward the semiconductor substrate 10 from a first via connection metal wiring layer VL1, which is one of the second to sixth metal wiring layers 20b to 20f, and may pass through the semiconductor substrate 10. The first via connection metal wiring layer VL1 may include the fourth metal wiring layer 20d.

The first via connection metal wiring layer VL1 may use the fourth metal wiring layer 20d, but is not limited thereto and may include one of the second to sixth metal wiring layers 20b to 20f. The first via connection metal wiring layer VL1 may be provided at a center portion of the second to sixth metal wiring layers 20b to 20f or at a middle portion of the back end level layer BEOL in the vertical direction (e.g., Z direction).

In a case where one of the second to sixth metal wiring layers 20b to 20f is used as the first via connection metal wiring layer VL1, a resistance of the first through via structure 31 may be reduced, compared to a case where the first metal wiring layer 20a is used as the first via connection metal wiring layer VL1. Furthermore, in a case where one of the second to sixth metal wiring layers 20b to 20f is used as the first via connection metal wiring layer VL1, a resistance of the first through via structure 31 may be easily adjusted.

The first through via structure 31 may pass through all of the first to third wiring insulation layers 18a to 18c configuring the back end level layer BEOL, the interlayer insulation layer 12 configuring the front end level layer FEOL, and the semiconductor substrate 10. The first through via structure 31 may have a first height h1. In some example embodiments, the first height h1 may be tens um. In some example embodiments, the first height h1 may be about 50 um to about 90 um.

The first through via structure 31, as illustrated in FIGS. 1 and 2, may include a first via hole 24 formed in the back end level layer BEOL, the front end level layer FEOL, and the semiconductor substrate 10, a first via insulation layer 28 formed on an inner wall of the first via hole 24, and a first via electrode 30 burying (e.g., filling) the first via hole 24 on the first via insulation layer 28.

In other words, as illustrated in FIGS. 1 and 2, the first through via structure 31 may include the first via hole 24 passing through all of the first to third wiring insulation layers 18a to 18c, the interlayer insulation layer 12, and the semiconductor substrate 10, the first via insulation layer 28 formed on the inner wall of the first via hole 24, and the first via electrode 30 burying (e.g., filling) the first via hole 24 on the first via insulation layer 28. The first via insulation layer 28 may include a silicon oxide layer or a silicon nitride layer. The first via electrode 30 may include a first via barrier layer 30a and a first via metal layer 30b. The first via electrode 30 may include a metal layer (e.g., a copper layer, an aluminum layer, or a tungsten layer). The first via barrier layer 30a may include a barrier metal layer (e.g., tantalum (Ta) or titanium nitride (TiN)).

The semiconductor device 1 may include a second through via structure 35. The second through via structure 35 may include a second TSV structure. The second through via structure 35 may include a signal transfer via structure or a power transfer via structure. The second through via structure 35 may be disposed apart from the first through via structure 31. The second through via structure 35 may be disposed apart from another side (e.g., an opposite side) of the integrated circuit layer 14 by a second separation distance sp2. In some example embodiments, the second separation distance sp2 may be several um to tens um. In some example embodiments, the second separation distance sp2 may be about 1 um to about 20 um.

The second through via structure 35 may have a second diameter d2, which is greater than the first diameter d1. The second diameter d2 may be a second critical dimension CD2. In some example embodiments, the second diameter d2 may be several um to tens um. In some example embodiments, the second diameter d2 may be about 1 um to about 15 um. When the second diameter d2 of the second through via structure 35 is greater than the first diameter d1 of the first through via structure 31, the second through via structure 35 may have a resistance, which is lower than that of the first through via structure 31.

In some example embodiments, when the second diameter d2 of the second through via structure 35 is greater than the first diameter d1 of the first through via structure 31, the second through via structure 35 may include a power transfer via structure, and the first through via structure 31 may include a signal transfer via structure.

The second through via structure 35 may vertically extend toward the semiconductor substrate 10 from a second via connection metal wiring layer VL2, which is one of the second to sixth metal wiring layers 20b to 20f, and may pass through the semiconductor substrate 10. The second via connection metal wiring layer VL2 may include the sixth metal wiring layer 20f. The second via connection metal wiring layer VL2 may include an uppermost sixth metal wiring layer 20f.

The second via connection metal wiring layer VL2 may use the sixth metal wiring layer 20f, but is not limited thereto and may use any one of the second to sixth metal wiring layers 20b to 20f. The second via connection metal wiring layer VL2 may be provided at a center portion of the second to sixth metal wiring layers 20b to 20f or at a middle portion of the back end level layer BEOL in the vertical direction (e.g., Z direction).

In a case where one of the second to sixth metal wiring layers 20b to 20f is used as the second via connection metal wiring layer VL2, a resistance of the second through via structure 35 may be reduced, compared to a case where the first metal wiring layer 20a is used as the second via connection metal wiring layer VL2. Furthermore, in a case where one of the second to sixth metal wiring layers 20b to 20f is used as the second via connection metal wiring layer VL2, a resistance of the second through via structure 35 may be easily adjusted.

The second through via structure 35 may have a second height h2, which is greater than the first height h1. In some example embodiments, the second height h2 may be tens um. In some example embodiments, the second height h2 may be about 50 um to about 90 um.

The second via connection metal wiring layer VL2 may be disposed at a level, which is different from that of the first via connection metal wiring layer VL1, on the semiconductor substrate 10. In other words, a level of the first through via structure 31 may differ from that of the second through via structure 35.

In some example embodiments, the second via connection metal wiring layer VL2 may be disposed at a level, which is higher than that of the first via connection metal wiring layer VL1, on the semiconductor substrate 10. In other words, a level of the second through via structure 35 may be higher than that of the first through via structure 31.

In a case where the second via connection metal wiring layer VL2 is disposed at a level, which is higher than that of the first via connection metal wiring layer VL1, the second through via structure 35 may have a resistance that is lower than that of the first through via structure 31. In other words, in a case where the second height h2 of the second through via structure 35 is greater than the first height h1 of the first through via structure 31, the second through via structure 35 may have a resistance that is lower than that of the first through via structure 31.

The second through via structure 35 may pass through all of the first to fifth wiring insulation layers 18a to 18e configuring the back end level layer BEOL, the interlayer insulation layer 12 configuring the front end level layer FEOL, and the semiconductor substrate 10.

The second through via structure 35, as illustrated in FIG. 1, may include a second via hole 26 formed in all of the back end level layer BEOL, the front end level layer FEOL, and the semiconductor substrate 10, a second via insulation layer 32 formed on an inner wall of the second via hole 26, and a second via electrode 34 burying (e.g., filling) the second via hole 26 on the second via insulation layer 32.

In other words, as illustrated in FIG. 1, the second through via structure 35 may include the second via hole 26 passing through all of the first to fifth wiring insulation layers 18a to 18e, the interlayer insulation layer 12, and the semiconductor substrate 10, the second via insulation layer 32 formed on the inner wall of the second via hole 26, and the second via electrode 34 burying (e.g., filling) the second via hole 26 on the second via insulation layer 32. The second via electrode 34, like FIG. 2, may include a via barrier layer.

Herein, an arrangement relationship between the integrated circuit layer 14, the first through via structure 31, and the second through via structure 35 will be described with reference to FIG. 3.

As illustrated in FIG. 3, the first through via structure 31 may be formed in a first keep-out zone KOZ1 disposed at one side of the integrated circuit layer 14. The first keep-out zone KOZ1 may be a region where the integrated circuit layer 14 is not formed. The integrated circuit layer 14 may be formed near the first keep-out zone KOZ1. As described above, the first through via structure 31 may have the first diameter d1. The first through via structure 31 may be disposed apart from the one side of the integrated circuit layer 14 by the first separation distance sp1.

The second through via structure 35 may be formed in a second keep-out zone KOZ2 disposed at another side (e.g., an opposite side) of the integrated circuit layer 14. The second keep-out zone KOZ2 may have the same area as that of the first keep-out zone KOZ1. The second keep-out zone KOZ2 may be a region where the integrated circuit layer 14 is not formed.

The integrated circuit layer 14 may be formed near the second keep-out zone KOZ2. As described above, the second through via structure 35 may have the second diameter d2, which is greater than the first diameter d1. The second through via structure 35 may be disposed apart from another side (e.g., an opposite side) of the integrated circuit layer 14 by the second separation distance sp2.

Furthermore, the semiconductor device 1 may include an upper pad 33. The upper pad 33 may be formed on the back end level layer BEOL. The upper pad 33 may be electrically connected to the uppermost sixth metal wiring layer 20f of the first to sixth metal wiring layers 20.

In other words, the upper pad 33 may be electrically connected to the uppermost sixth metal wiring layer 20f of the first to sixth metal wiring layers 20 through the sixth wiring via layer 22f. According to some example embodiments, a solder bump, which is an external connection terminal, may be further formed on the upper pad 33.

According to some example embodiments, another semiconductor device (not shown) may be stacked on and bonded to the upper pad 33. In this case, the upper pad 33 may be insulated by an upper protection insulation layer (not shown) formed on the sixth wiring insulation layer 18f.

According to some example embodiments, the semiconductor device 1 may include a lower pad 48. The lower pads 48 may be electrically connected to the first through via structure 31 and the second through via structure 35 in a bottom surface of the semiconductor substrate 10. The lower pad 48 may be insulated from the semiconductor substrate 10 by a lower protection insulation layer 46 disposed on the second surface 10b of the semiconductor substrate 10. The lower protection insulation layer 46 may include a silicon oxide layer or a silicon nitride layer.

The lower protection insulation layer 46 may configure an insulation level layer INL on the second surface 10b of the semiconductor substrate 10. The first through via structure 31 may have the first height h1 up to the first via connection metal wiring layer VL1 from a bottom surface (e.g., a surface in contact with the insulation level layer INL) of the lower pad 48. The second through via structure 35 may have the second height h2, which is greater than the first height h1, up to the second via connection metal wiring layer VL2 from the bottom surface (e.g., a surface in contact with the insulation level layer INL) of the lower pad 48.

According to some example embodiments, a solder bump, which is an external connection terminal, may be further formed on the lower pad 48. According to some example embodiments, another semiconductor device (not shown) may be stacked on and bonded to the lower pad 48.

In the semiconductor device 1 described above, the first through via structure 31 may be connected to the first via connection metal wiring layer VL1 provided at a center portion of the back end level layer BEOL or at a middle portion of the back end level layer BEOL in the vertical direction (e.g., Z direction), and the second through via structure 35 may be connected to the second via connection metal wiring layer VL2 provided at the center portion of the back end level layer BEOL or at a middle portion of the back end level layer BEOL in the vertical direction (e.g., Z direction). The top surface of the first through via structure 31 may be at a different level from the top surface of the second through via structure 35.

Therefore, the semiconductor device 1 may decrease or easily adjust a resistance by using the first through via structure 31 and the second through via structure 35 each connected to the center portion of the back end level layer BEOL or each connected to a middle portion of the back end level layer BEOL in the vertical direction (e.g., Z direction). The semiconductor device 1 may adjust the first diameter d1 of the first through via structure 31 and the second diameter d2 of the second through via structure 35 and may easily adjust a resistance by using the first through via structure 31 and the second through via structure 35.

Furthermore, the semiconductor device 1 may adjust the first and second separation distances sp1 and sp2 between the first and second through via structures 31 and 35 and the integrated circuit layer 14, thereby mitigating or preventing the electrical performance of the integrated circuit layer 14 from being reduced.

Figure 4:
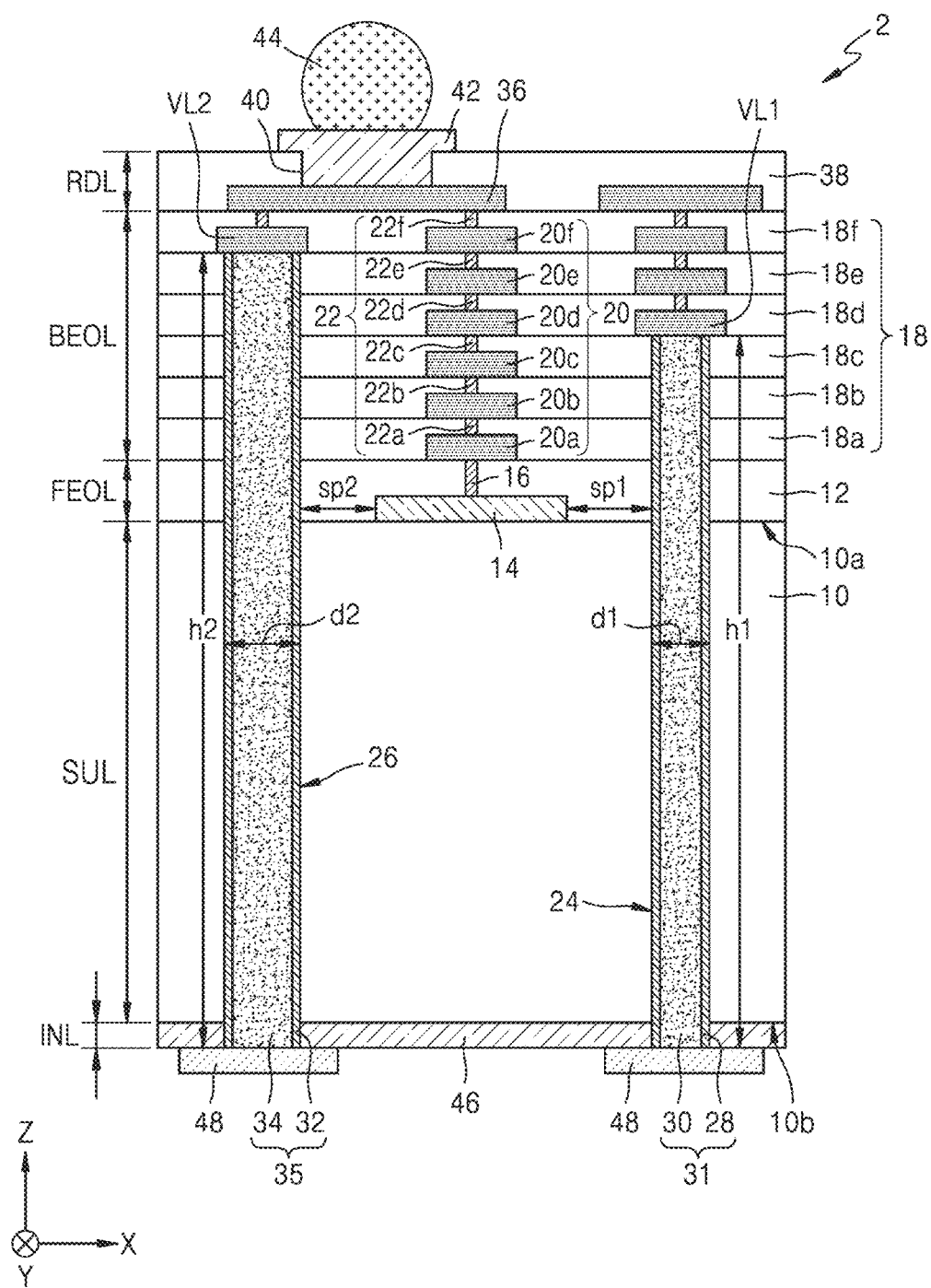
FIG. 4 is a cross-sectional view for describing a semiconductor device according to an example embodiment.

FIG. 4 is a cross-sectional view for describing a semiconductor device 2 according to an example embodiment.

Except for that a redistribution layer 36, a bump pad 42, and a solder bump 44 are further formed, the semiconductor device 2 may be the same as the semiconductor device 1 of FIGS. 1 to 3. In FIG. 4, the same reference numerals as FIGS. 1 to 3 refer to like elements. In FIG. 4, descriptions given above with reference to FIGS. 1 to 3 are briefly given or omitted.

The semiconductor device 2 may further include a redistribution level layer RDL on a back end level layer BEOL on a semiconductor substrate 10. According to some example embodiments, the redistribution level layer RDL may be omitted. The redistribution level layer RDL may include the redistribution layer 36, electrically connected to a sixth metal wiring layer 20f and a sixth wiring via layer 22f, and the redistribution insulation layer 38 formed on the redistribution layer 36.

The redistribution layer 36 may include a metal layer (e.g., a copper layer, an aluminum layer, or a tungsten layer). The redistribution insulation layer 38 may include a silicon oxide layer. In the semiconductor device 2, the bump pad 42 may be formed in a redistribution exposure hole 40 exposing the redistribution layer 36 in the redistribution insulation layer 38. A solder bump 44, which is an external connection terminal, may be formed on the bump pad 42.

The semiconductor device 2 may decrease or adjust a resistance of each of the first through via structure 31 and the second through via structure 35, and enhance the degree of wiring freedom by using the redistribution level layer RDL.

Figure 5:
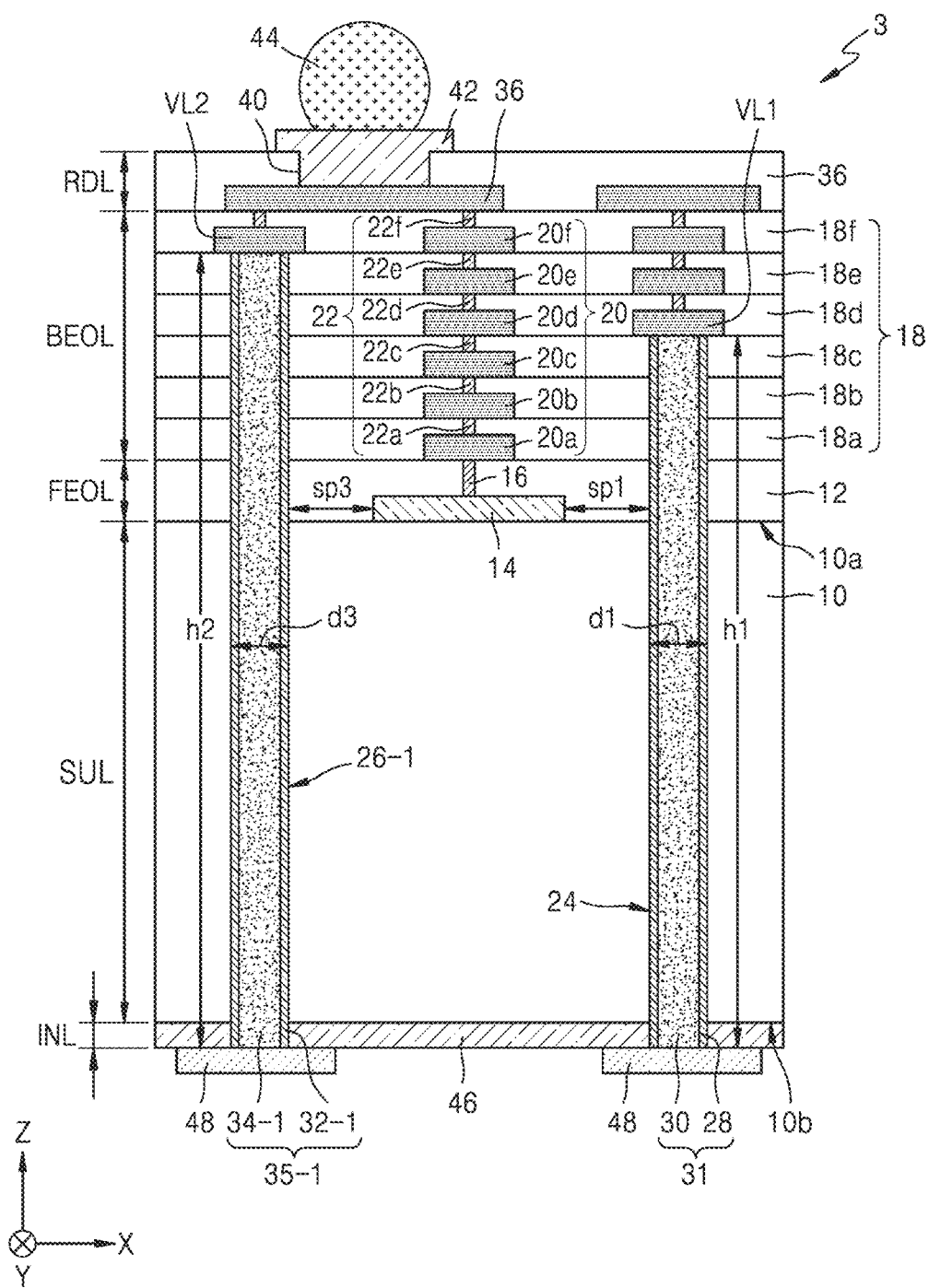
FIG. 5 is a cross-sectional view for describing a semiconductor device according to an example embodiment.
Figure 6:
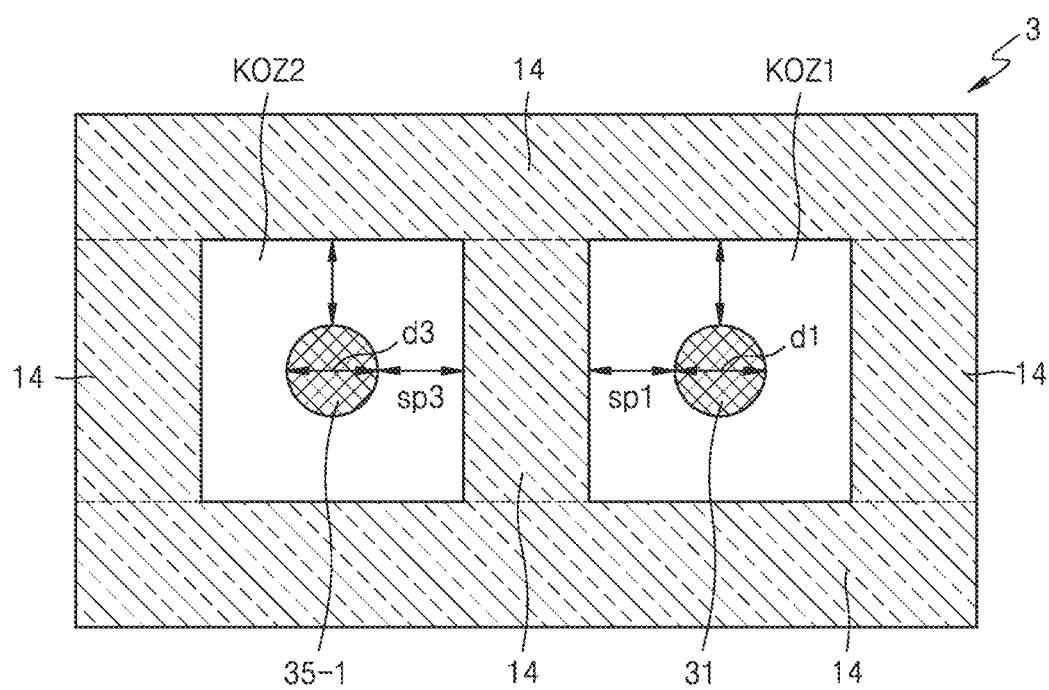
FIG. 6 is a plan view for describing an arrangement relationship between an integrated circuit layer and through via structures of FIG. 5.

FIG. 5 is a cross-sectional view for describing a semiconductor device 3 according to an example embodiment, and FIG. 6 is a plan view for describing an arrangement relationship between an integrated circuit layer and through via structures of FIG. 5.

Except for that a size and arrangement of a second through via structure 35-1 are differently implemented, the semiconductor device 3 may be the same as the semiconductor device 1 of FIGS. 1 to 3 and the semiconductor device 2 of FIG. 4. In FIGS. 5 and 6, the same reference numerals as FIGS. 1 to 4 refer to like elements. In FIGS. 5 and 6, descriptions given above with reference to FIGS. 1 to 4 are briefly given or omitted.

The semiconductor device 3 may include a first through via structure 31 and a second through via structure 35-1. The second through via structure 35-1, as illustrated in FIG. 5, may include a second via hole 26-1 formed in all of a back end level layer BEOL, a front end level layer FEOL, and a semiconductor substrate 10, a second via insulation layer 32-1 formed on an inner wall of the second via hole 26-1, and a second via electrode 34-1 burying (e.g., filling) the second via hole 26-1 on the second via insulation layer 32-1.

A second diameter d3 of the second through via structure 35-1 may be the same as a first diameter d1 of the first through via structure 31. In some example embodiments, the first diameter d1 and the second diameter d3 may be several um to tens um.

As illustrated in FIG. 6, the first through via structure 31 may be formed in a first keep-out zone KOZ1 disposed at one side of an integrated circuit layer 14. The second through via structure 35-1 may be formed in a second keep-out zone KOZ2 disposed at another side (e.g., an opposite side) of the integrated circuit layer 14.

As illustrated in FIGS. 5 and 6, the first through via structure 31 may be disposed apart from one side of the integrated circuit layer 14 by a first separation distance sp1. The second through via structure 35-1 may be disposed apart from another side (e.g., an opposite side) of the integrated circuit layer 14 by a second separation distance sp3, which is the same as the first separation distance sp1.

As described above, in the semiconductor device 3, a resistance of the second through via structure 35-1 may be reduced or easily adjusted by adjusting the second diameter d3 of the second through via structure 35-1. In the semiconductor device 3, a reduction in performance of the integrated circuit layer 14 may be mitigate or prevented by adjusting the second separation distance sp3 between the integrated circuit layer 14 and the second through via structure 35-1 in the second keep-out zone KOZ2.

Figure 7:
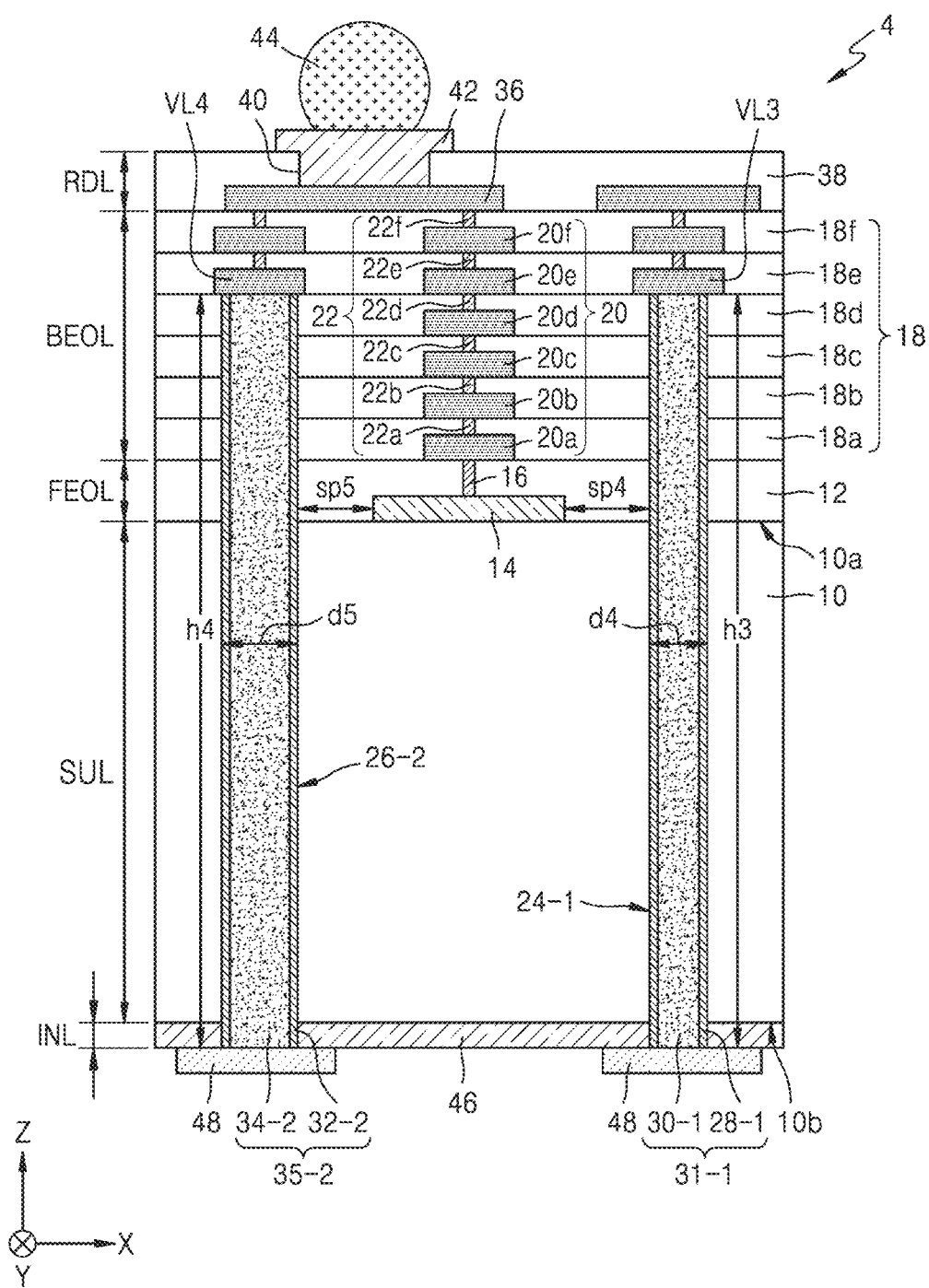
FIG. 7 is a cross-sectional view for describing a semiconductor device according to an example embodiment.
Figure 8:
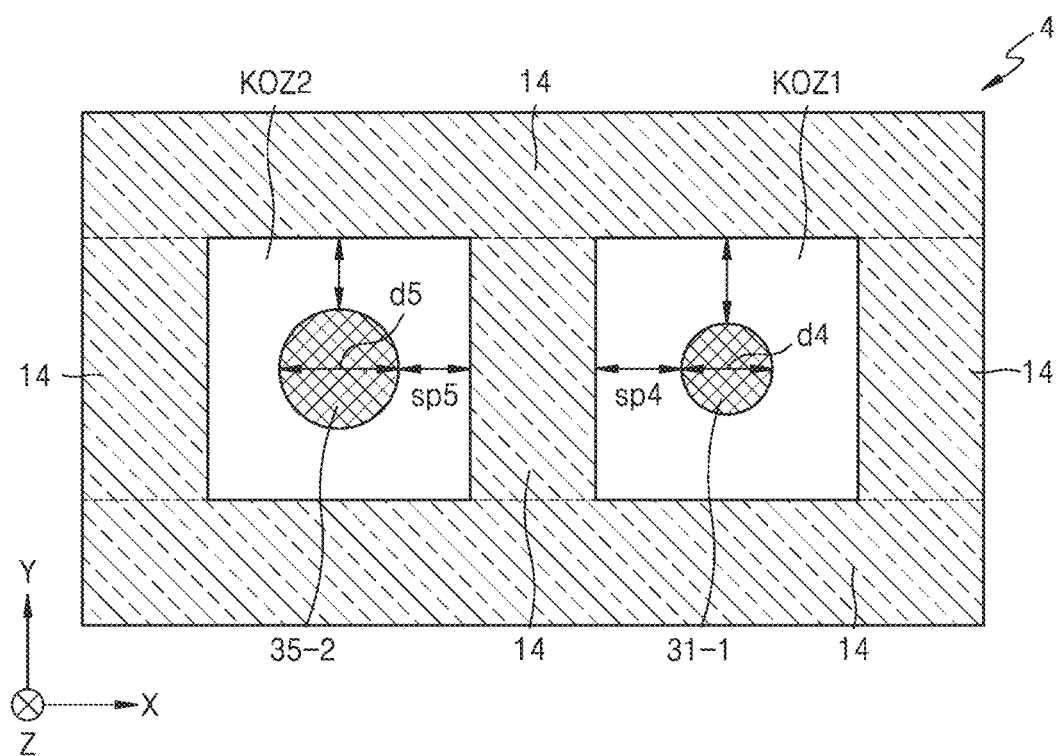
FIG. 8 is a plan view for describing an arrangement relationship between an integrated circuit layer and through via structures of FIG. 7.

FIG. 7 is a cross-sectional view for describing a semiconductor device 4 according to an example embodiment, and FIG. 8 is a plan view for describing an arrangement relationship between an integrated circuit layer and through via structures of FIG. 7.

Except for that a level of the top surface of a first through via structure 35-1 is the same as that of a second through via structure 35-2, the semiconductor device 4 may be the same as the semiconductor device 1 of FIGS. 1 to 3 and the semiconductor device 2 of FIG. 4. In FIGS. 7 and 8, the same reference numerals as FIGS. 1 to 4 refer to like elements. In FIGS. 7 and 8, descriptions given above with reference to FIGS. 1 to 4 are briefly given or omitted.

The semiconductor device 4 may include a first through via structure 31-1 and a second through via structure 35-2. The first through via structure 31-1 may be disposed apart from one side of an integrated circuit layer 14 by a first separation distance sp4. In some example embodiments, the first separation distance sp4 may be several um to tens um. In some example embodiments, the first separation distance sp4 may be about 1 um to about 20 um.

The first through via structure 31-1 may have a first diameter d4. The first diameter d4 may be a first critical dimension CD1. In some example embodiments, the first diameter d4 may be several um to tens um. In some example embodiments, the first diameter d4 may be about 1 um to about 15 um.

The first through via structure 31-1 may vertically extend toward a semiconductor substrate 10 from a first via connection metal wiring layer VL3, which is one of second to sixth metal wiring layers 20b to 20f, and may pass through the semiconductor substrate 10. The first via connection metal wiring layer VL3 may include the fifth metal wiring layer 20e.

The first via connection metal wiring layer VL3 may use the fifth metal wiring layer 20e, but is not limited thereto and may include any one of the second to sixth metal wiring layers 20b to 20f. The first via connection metal wiring layer VL3 may be provided at a center portion of the second to sixth metal wiring layers 20b to 20f or at a middle portion of the back end level layer BEOL in the vertical direction (e.g., Z direction).

The first through via structure 31-1 may pass through all of first to fourth wiring insulation layers 18a to 18d configuring a back end level layer BEOL, an interlayer insulation layer 12 configuring a front end level layer FEOL, and the semiconductor substrate 10. The first through via structure 31-1 may have a first height h3. In some embodiments, the first height h3 may be tens um. In some example embodiments, the first height h3 may be about 50 um to about 90 um.

The first through via structure 31-1, as illustrated in FIG. 7, may include a first via hole 24-1 formed in all of the back end level layer BEOL, the front end level layer FEOL, and the semiconductor substrate 10, a first via insulation layer 28-1 formed on an inner wall of the first via hole 24-1, and a first via electrode 30-1 burying (e.g., filling) the first via hole 24-1 on the first via insulation layer 28-1.

In other words, as illustrated in FIG. 7, the first through via structure 31-1 may include the first via hole 24-1 passing through all of the first to fourth wiring insulation layers 18a to 18d, the interlayer insulation layer 12, and the semiconductor substrate 10, the first via insulation layer 28-1 formed on the inner wall of the first via hole 24-1, and the first via electrode 30-1 burying (e.g., filling) the first via hole 24-1 on the first via insulation layer 28-1. The first via electrode 30-1 may include a first via barrier layer (not shown) and a first via metal layer (not shown).

The semiconductor device 4 may include a second through via structure 35-2. The second through via structure 35-2 may be disposed apart from the first through via structure 31-1. The second through via structure 35-2 may be disposed apart from another side (e.g., an opposite side) of the integrated circuit layer 14 by a second separation distance sp5. In some example embodiments, the second separation distance sp5 may be several um to tens um. In some example embodiments, the second separation distance sp5 may be about 1 um to about 20 um.

The second through via structure 35-2 may have a second diameter d5, which is greater than the first diameter d4. The second diameter d5 may be a second critical dimension CD2. In some example embodiments, the second diameter d5 may be several um to tens um. In some example embodiments, the second diameter d5 may be about 1 um to about 15 um. When the second diameter d5 of the second through via structure 35-2 is greater than the first diameter d4 of the first through via structure 31-1, the second through via structure 35-2 may have a resistance that is lower than that of the first through via structure 31-1.

In some example embodiments, when the second diameter d5 of the second through via structure 35-2 is greater than the first diameter d4 of the first through via structure 31-1, the second through via structure 35-2 may include a power transfer via structure, and the first through via structure 31-1 may include a signal transfer via structure.

The second through via structure 35-2 may vertically extend toward the semiconductor substrate 10 from a second via connection metal wiring layer VL4, which is one of the second to sixth metal wiring layers 20b to 20f, and may pass through the semiconductor substrate 10. The second via connection metal wiring layer VL4 may include the fifth metal wiring layer 20e. The second via connection metal wiring layer VL4 may include a middle wiring layer, that is, the fifth metal wiring layer 20e.

The second via connection metal wiring layer VL4 may use the fifth metal wiring layer 20e, but is not limited thereto and may include any one of the second to sixth metal wiring layers 20b to 20f. The second via connection metal wiring layer VL4 may be provided at a center portion of the second to sixth metal wiring layers 20b to 20f or at a middle portion of the back end level layer BEOL in the vertical direction (e.g., Z direction).

The second through via structure 35-2 may have a second height h4, which is the same as the first height h3. In some example embodiments, the second height h4 may be tens um. In some example embodiments, the second height h4 may be about 50 um to about 90 um.

The second via connection metal wiring layer VL4 may be disposed at a level, which is the same as that of the first via connection metal wiring layer VL3. In other words, a level of the first through via structure 31-1 may be different from that of the second through via structure 35-2.

The second through via structure 35-2 may pass through all of the first to fifth wiring insulation layers 18a to 18d configuring the back end level layer BEOL, the interlayer insulation layer 12 configuring the front end level layer FEOL, and the semiconductor substrate 10. The second through via structure 35-2, as illustrated in FIG. 7, may include a second via hole 26-2 formed in all of the back end level layer BEOL, the front end level layer FEOL, and the semiconductor substrate 10, a second via insulation layer 32-2 formed on an inner wall of the second via hole 26-2, and a second via electrode 34-2 burying (e.g., filling) the second via hole 26-2 on the second via insulation layer 32-2.

In other words, as illustrated in FIG. 7, the second through via structure 35-2 may include the second via hole 26-2 passing through all of the first to fourth wiring insulation layers 18a to 18d, the interlayer insulation layer 12, and the semiconductor substrate 10, the second via insulation layer 32-2 formed on the inner wall of the second via hole 26-2, and the second via electrode 34-2 burying (e.g., filling) the second via hole 26-2 on the second via insulation layer 32-2. The second via electrode 34-2 may include a via barrier layer (not shown).

Herein, an arrangement relationship between the integrated circuit layer 14, the first through via structure 31-1, and the second through via structure 35-2 will be described with reference to FIG. 8.

As illustrated in FIG. 8, the first through via structure 31-1 may be formed in a first keep-out zone KOZ1 disposed at one side of the integrated circuit layer 14. The integrated circuit layer 14 may be formed near the first keep-out zone KOZ1. As described above, the first through via structure 31-1 may have the first diameter d4. The first through via structure 31-1 may be disposed apart from one side of the integrated circuit layer 14 by the first separation distance sp4.

The second through via structure 35-2 may be formed in a second keep-out zone KOZ2 disposed at another side (e.g., an opposite side) of the integrated circuit layer 14. The second keep-out zone KOZ2 may have the same area as that of the first keep-out zone KOZ1. The integrated circuit layer 14 may be formed near the second keep-out zone KOZ2. As described above, the second through via structure 35-2 may have the second diameter d5, which is greater than the first diameter d4. The second through via structure 35-2 may be disposed apart from another side (e.g., an opposite side) of the integrated circuit layer 14 by the second separation distance sp5.

The first through via structure 31-1 may have the first height h3 up to the first via connection metal wiring layer VL3 from a bottom surface (e.g., a surface in contact with the insulation level layer INL) of a lower pad 48. The second through via structure 35-2 may have the second height h4, which is the same as the first height h3, up to the second via connection metal wiring layer VL4 from the bottom surface (e.g., a surface in contact with the insulation level layer INL) of the lower pad 48.

In the semiconductor device 4 described above, the first through via structure 31-1 may be connected to the first via connection metal wiring layer VL3 provided at a center portion of the back end level layer BEOL or at a middle portion of the back end level layer BEOL in the vertical direction (e.g., Z direction), and the second through via structure 35-2 may be connected to the second via connection metal wiring layer VL4 provided at the center portion of the back end level layer BEOL or at a middle portion of the back end level layer BEOL in the vertical direction (e.g., Z direction). A level of the first through via structure 31-1 may be the same as that of the second through via structure 35-2.

Therefore, the semiconductor device 4 may decrease or easily adjust a resistance by using the first through via structure 31-1 and the second through via structure 35-2 each connected to the center portion of the back end level layer BEOL or each connected to a middle portion of the back end level layer BEOL in the vertical direction (e.g., Z direction). The semiconductor device 4 may adjust a diameter of each of the first through via structure 31-1 and the second through via structure 35-2, and may easily adjust a resistance of each of the first through via structure 31-1 and the second through via structure 35-2.

Furthermore, the semiconductor device 4 may adjust the first and second separation distances sp4 and sp5 between the first and second through via structures 31-1 and 35-2 and the integrated circuit layer 14, thereby mitigating or preventing the electrical performance of the integrated circuit layer 14 from being reduced.

Figure 9:
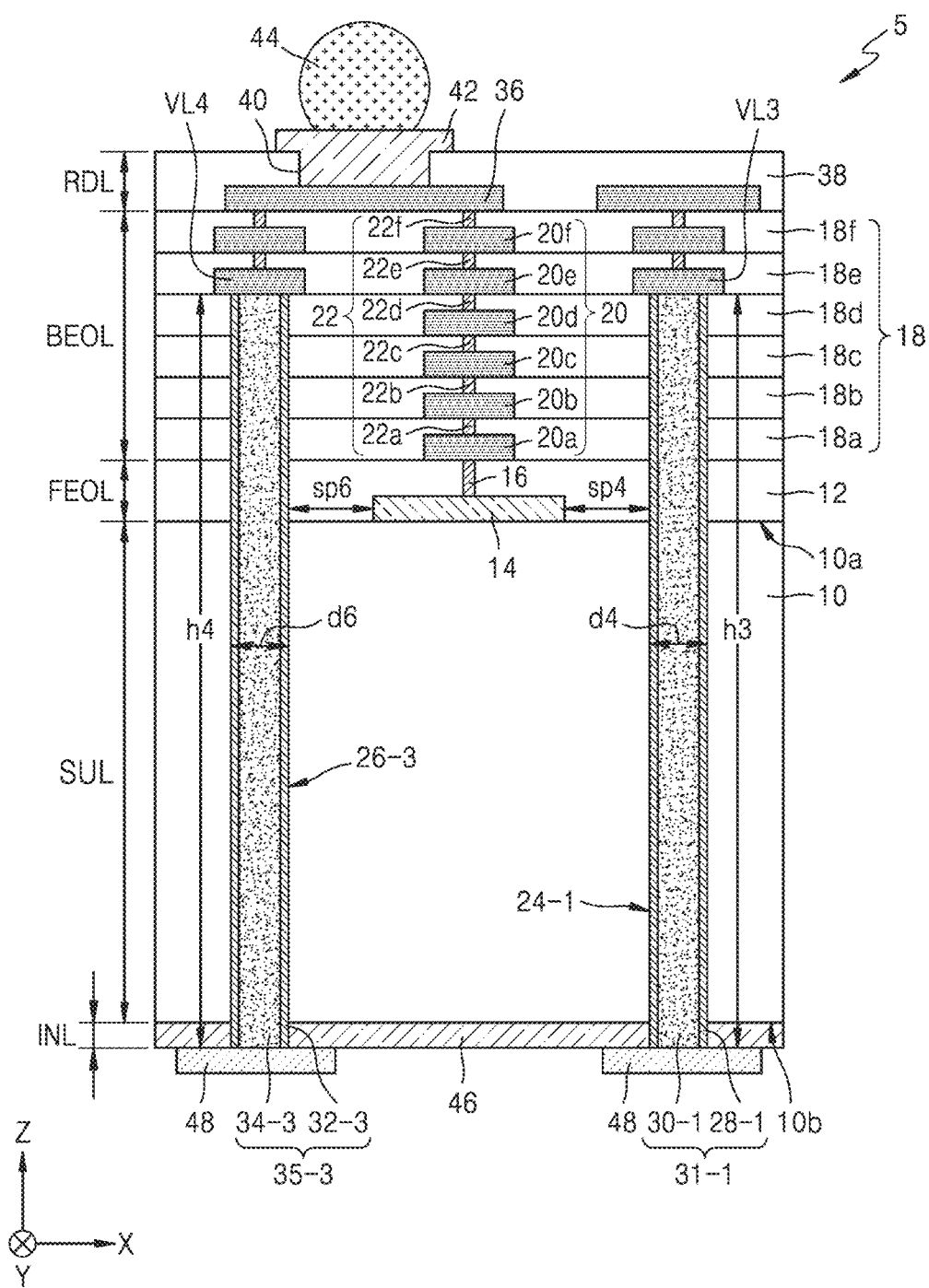
FIG. 9 is a cross-sectional view for describing a semiconductor device according to an example embodiment.
Figure 10:
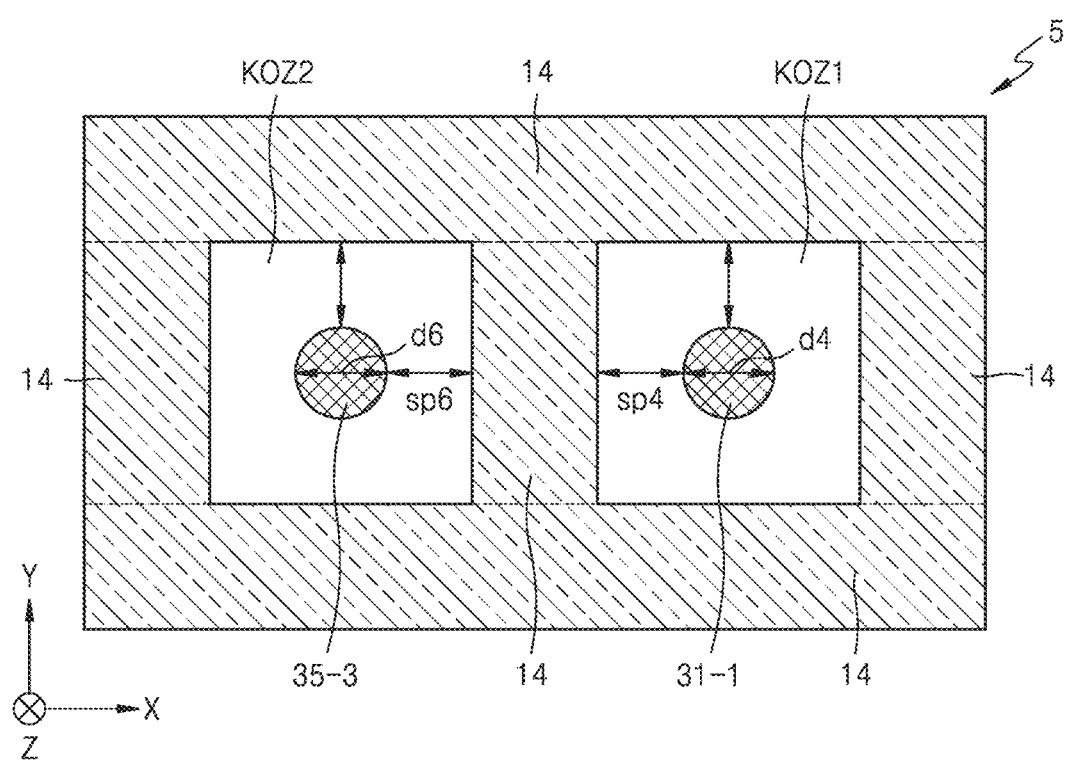
FIG. 10 is a plan view for describing an arrangement relationship between an integrated circuit layer and through via structures of FIG. 9.

FIG. 9 is a cross-sectional view for describing a semiconductor device 5 according to an example embodiment, and FIG. 10 is a plan view for describing an arrangement relationship between an integrated circuit layer and through via structures of FIG. 9.

Except for that a size and arrangement of a second through via structure 35-3 are differently implemented, the semiconductor device 5 may be the same as the semiconductor device 4 of FIGS. 7 and 8. In FIGS. 9 and 10, the same reference numerals as FIGS. 7 and 8 refer to like elements. In FIGS. 9 and 10, descriptions given above with reference to FIGS. 7 and 8 are briefly given or omitted.

The semiconductor device 5 may include a first through via structure 31-1 and a second through via structure 35-3. The second through via structure 35-3, as illustrated in FIG. 9, may include a second via hole 26-3 formed in all of a back end level layer BEOL, a front end level layer FEOL, and a semiconductor substrate 10, a second via insulation layer 32-3 formed on an inner wall of the second via hole 26-3, and a second via electrode 34-3 burying (e.g., filling) the second via hole 26-3 on the second via insulation layer 32-3.

A second diameter d6 of the second through via structure 35-3 may be the same as a first diameter d4 of the first through via structure 31-1. In some example embodiments, the first diameter d4 and the second diameter d6 may be several um to tens um.

As illustrated in FIG. 10, the first through via structure 31-1 may be formed in a first keep-out zone KOZ1 disposed at one side of an integrated circuit layer 14. The second through via structure 35-3 may be formed in a second keep-out zone KOZ2 disposed at another side (e.g., an opposite side) of the integrated circuit layer 14.

As illustrated in FIGS. 9 and 10, the first through via structure 31-1 may be disposed apart from one side of the integrated circuit layer 14 by a first separation distance sp4. The second through via structure 35-3 may be disposed apart from another side (e.g., an opposite side) of the integrated circuit layer 14 by a second separation distance sp6, which is the same as the first separation distance sp4.

As described above, in the semiconductor device 5, a resistance of the second through via structure 35-3 may be reduced or easily adjusted by adjusting the second diameter d6 of the second through via structure 35-3. Further, in the semiconductor device 5, a reduction in performance of the integrated circuit layer 14 may be mitigated or prevented by adjusting the second separation distance sp6 between the integrated circuit layer 14 and the second through via structure 35-3 in the second keep-out zone KOZ2.

Figure 11:
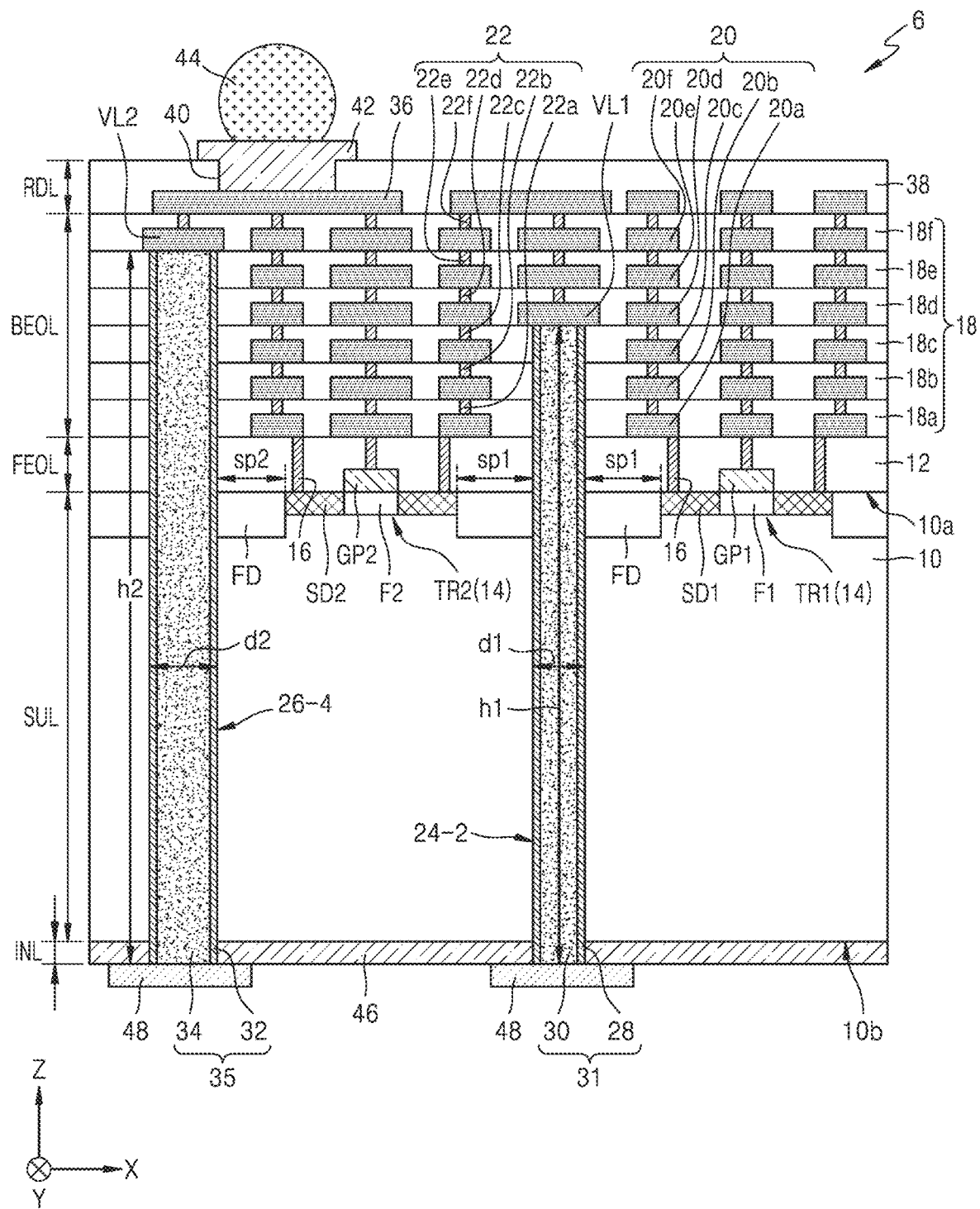
FIG. 11 is a cross-sectional view for describing a semiconductor device according to an example embodiment.
Figure 12:
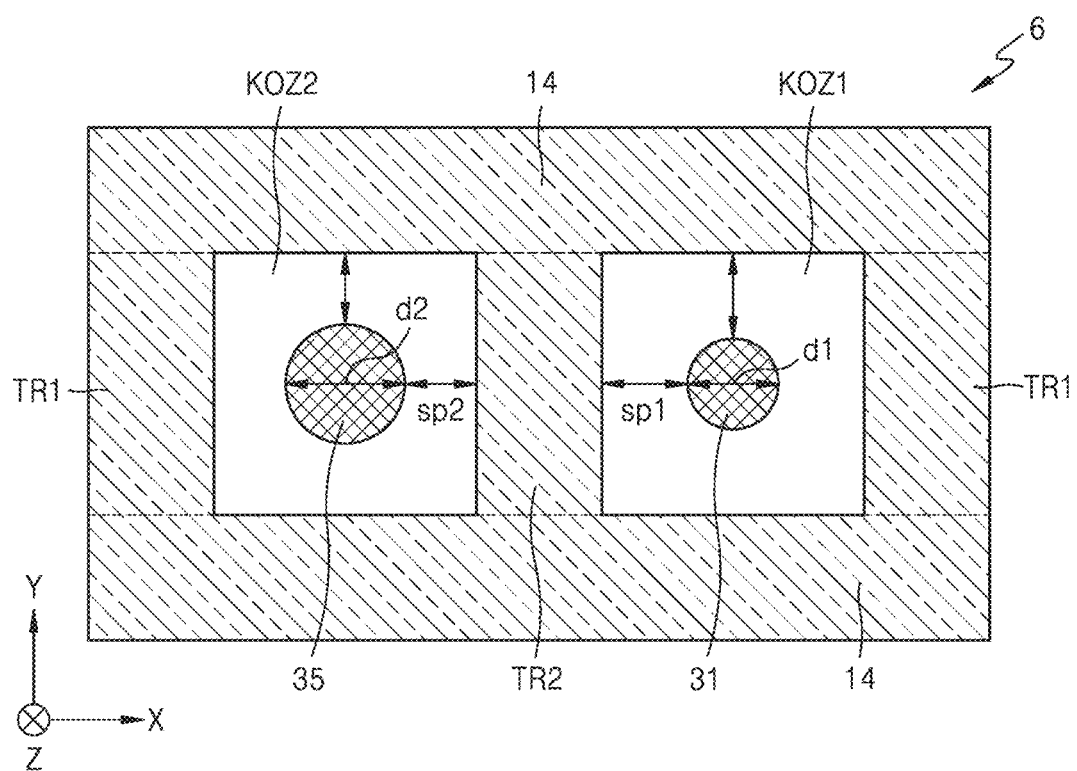
FIG. 12 is a plan view for describing an arrangement relationship between an integrated circuit layer and through via structures of FIG. 11.

FIG. 11 is a cross-sectional view for describing a semiconductor device 6 according to an example embodiment, and FIG. 12 is a plan view for describing an arrangement relationship between an integrated circuit layer and through via structures of FIG. 11.

Except for that the semiconductor device 6 includes first and second transistors TR1 and TR2 configuring an integrated circuit layer 14, the semiconductor device 6 may be the same as the semiconductor device 1 of FIGS. 1 to 3 and the semiconductor device 2 of FIG. 4. In FIGS. 11 and 12, the same reference numerals as FIGS. 1 to 4 refer to like elements. In FIGS. 11 and 12, descriptions given above with reference to FIGS. 1 to 4 are briefly given or omitted.

The semiconductor device 6 may include the first and second transistors TR1 and TR2 configuring the integrated circuit layer 14. The first and second transistors TR1 and TR2 may each include a fin type transistor. The first transistor TR1 may include an N type transistor. The second transistor TR2 may include a P type transistor.

The first transistor TR1 may be formed at a first portion of a semiconductor substrate 10 limited by an isolation region FD. The isolation region FD may be a trench isolation region. The isolation region FD may include an insulation layer. The first transistor TR1 may include a first fin F1, a first source/drain region SD1 disposed at both sides of the first fin F1, and a first gate GP1 formed on the first fin F1. The first source/drain region SD1 and the first gate GP1 may be electrically connected to a first metal wiring layer 20a through a contact plug layer 16.

The second transistor TR2 may be disposed apart from the first transistor TR1. The second transistor TR2 may be formed at a second portion of the semiconductor substrate 10 limited by the isolation region FD. The second transistor TR2 may include a second fin F2, a second source/drain region SD2 disposed at both sides of the second fin F2, and a second gate GP2 formed on the second fin F2. The second source/drain region SD2 and the second gate GP2 may be electrically connected to the first metal wiring layer 20a through the contact plug layer 16.

The semiconductor device 6 may include a first through via structure 31 and a second through via structure 35. As illustrated in FIGS. 11 and 12, the first through via structure 31 may be formed between the first transistor TR1 and the second transistor TR2. The second through via structure 35 may be formed between the first transistor TR1 and the second transistor TR2.

The first through via structure 31, as illustrated in FIG. 11, may include a first via hole 24 formed in all of a back end level layer BEOL, a front end level layer FEOL, the isolation region FD, and a semiconductor substrate 10, a first via insulation layer 28 formed on an inner wall of the first via hole 24, and a first via electrode 30 burying (e.g., filling) the first via hole 24 on the first via insulation layer 28.

The second through via structure 35, as illustrated in FIG. 11, may include a second via hole 26 formed in all of the back end level layer BEOL, the front end level layer FEOL, the isolation region FD, and the semiconductor substrate 10, a second via insulation layer 32 formed on an inner wall of the second via hole 26, and a second via electrode 34 burying (e.g., filling) the second via hole 26 on the first via insulation layer 32.

As illustrated in FIG. 12, the first through via structure 31 may be formed in a first keep-out zone KOZ1 disposed at one side of an integrated circuit layer 14 (e.g., the second transistor TR2). The first through via structure 31 may be formed in the first keep-out zone KOZ1 disposed at the one side of the integrated circuit layer 14 (e.g., the first transistor TR1). The second through via structure 35 may be formed in a second keep-out zone KOZ2 disposed at another side (e.g., an opposite side) of the integrated circuit layer 14 (e.g., the second transistor TR2).

As illustrated in FIGS. 11 and 12, the first through via structure 31 may be disposed apart from one side of the integrated circuit layer 14 (e.g., the second transistor TR2) by a first separation distance sp1. The second through via structure 35 may be disposed apart from another side (e.g., an opposite side) of the integrated circuit layer 14 (e.g., the second transistor TR2) by a second separation distance sp2, which is less than the first separation distance sp1.

As described above, in the semiconductor device 5, the first transistor TR1 and the second transistor TR2 each configuring the integrated circuit layer 14 may be formed on the semiconductor substrate 10, and the first through via structure 31 and the second through via structure 35 may be easily formed between the first transistor TR1 and the second transistor TR2.

In the semiconductor device 5, a resistance may be easily reduced or adjusted by using the first through via structure 31 and the second through via structure 35 each connected to a center portion of the back end level layer BEOL or each connected to a middle portion of the back end level layer BEOL in the vertical direction (e.g., Z direction).

Furthermore, the semiconductor device 5 may adjust the first and second separation distances sp1 and sp2 between the first and second through via structures 31 and 35 and the first and second transistors TR1 and TR2 configuring the integrated circuit layer 14, thereby mitigating or preventing the electrical performance of the first and second transistors TR1 and TR2 from being reduced.

FIGS. 13 to 16 are cross-sectional views for describing a method of manufacturing the semiconductor device of FIG. 1.

Figure 13:
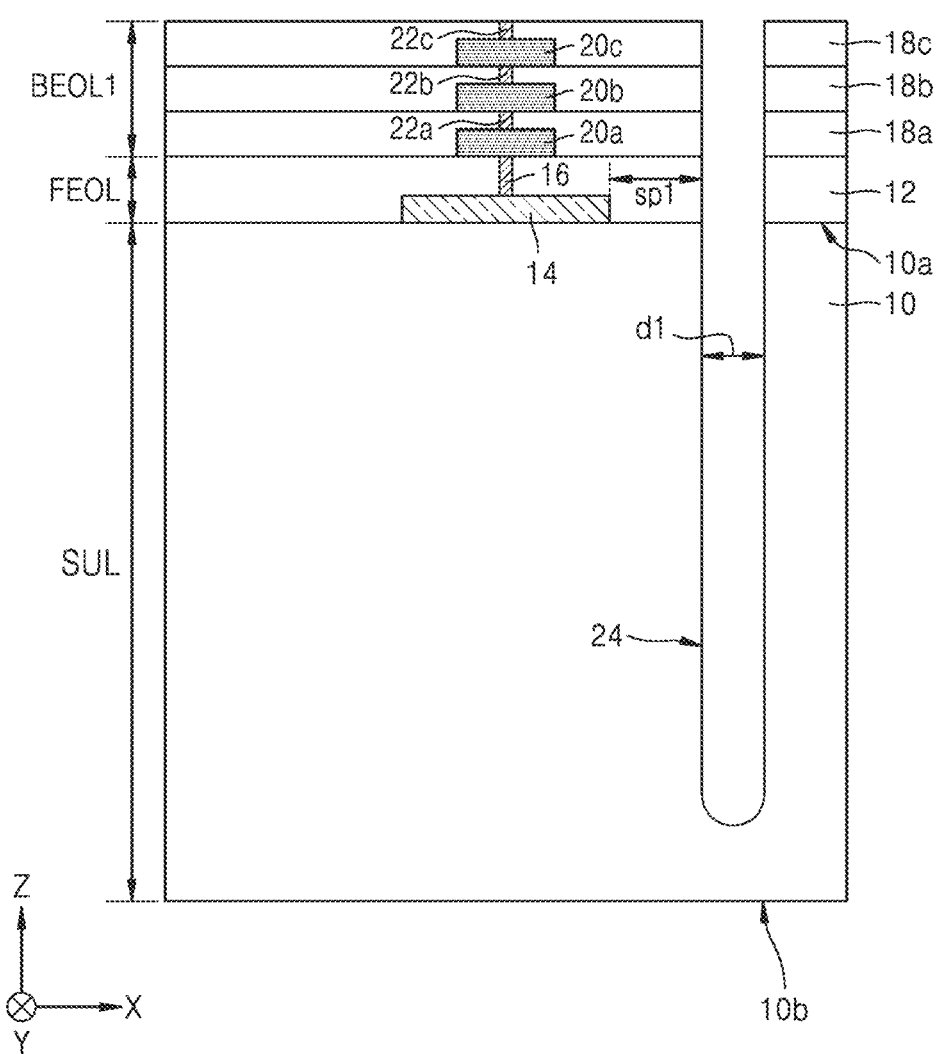
FIGS. 13 to 16 are cross-sectional views for describing a method of manufacturing the semiconductor device of FIG. 1.

Referring to FIG. 13, a semiconductor substrate 10 including a first surface 10a and a second surface 10b opposite to the first surface 10a may be prepared. The semiconductor substrate 10 may configure a substrate level layer SUL. An integrated circuit layer 14 may be formed on the first surface 10a of the semiconductor substrate 10. The integrated circuit layer 14 may include a plurality of circuit elements (e.g., transistors, capacitors, and/or registers).

An interlayer insulation layer 12 may be formed on the semiconductor substrate 10 and the integrated circuit layer 14. The interlayer insulation layer 12 may include a silicon oxide layer. A contact plug layer 16 electrically connected to the integrated circuit layer 14 may be formed in the interlayer insulation layer 12. The contact plug layer 16 may include a metal layer (e.g., a tungsten layer). The integrated circuit layer 14, the interlayer insulation layer 12, and the contact plug layer 16 each formed on the semiconductor layer 10 may configure a front end level layer FEOL.

A first back end level layer BEOL1 may be formed on the front end level layer FEOL. The first back end level layer BEOL1 may include first to third metal wiring layers 20a to 20c, first to third wiring insulation layers 18a to 18c, and first to third wiring via layers 22a to 22c. The first and third wiring via layers 22a and 22b may electrically connect the first to third metal wiring layers 20a to 20c. The first metal wiring layer 20a may be electrically connected to the contact plug layer 16.

The first to third metal wiring layers 20a to 20c may each include a metal layer (e.g., a copper layer, an aluminum layer, or a tungsten layer). The first to third wiring insulation layers 18a to 18c may each include a silicon oxide layer. The first to third wiring via layers 22a to 22c may each include a metal layer (e.g., a copper layer, an aluminum layer, or a tungsten layer).

Subsequently, a first via hole 24 may be formed by selectively etching the first to third wiring insulation layers 18a to 18c, the interlayer insulation layer 12, and the semiconductor substrate 10. The first via hole 24 may be formed in the first to third wiring insulation layers 18a to 18c, the interlayer insulation layer 12, and the semiconductor substrate 10. The first via hole 24 may be formed by using a photolithography process. The first via hole 24 may be formed to have a first diameter d1. The first via hole 24 may be formed apart from one side of the integrated circuit layer 14 by a first separation distance sp1. The first via hole 24 may be referred to as a first via trench.

Figure 14:
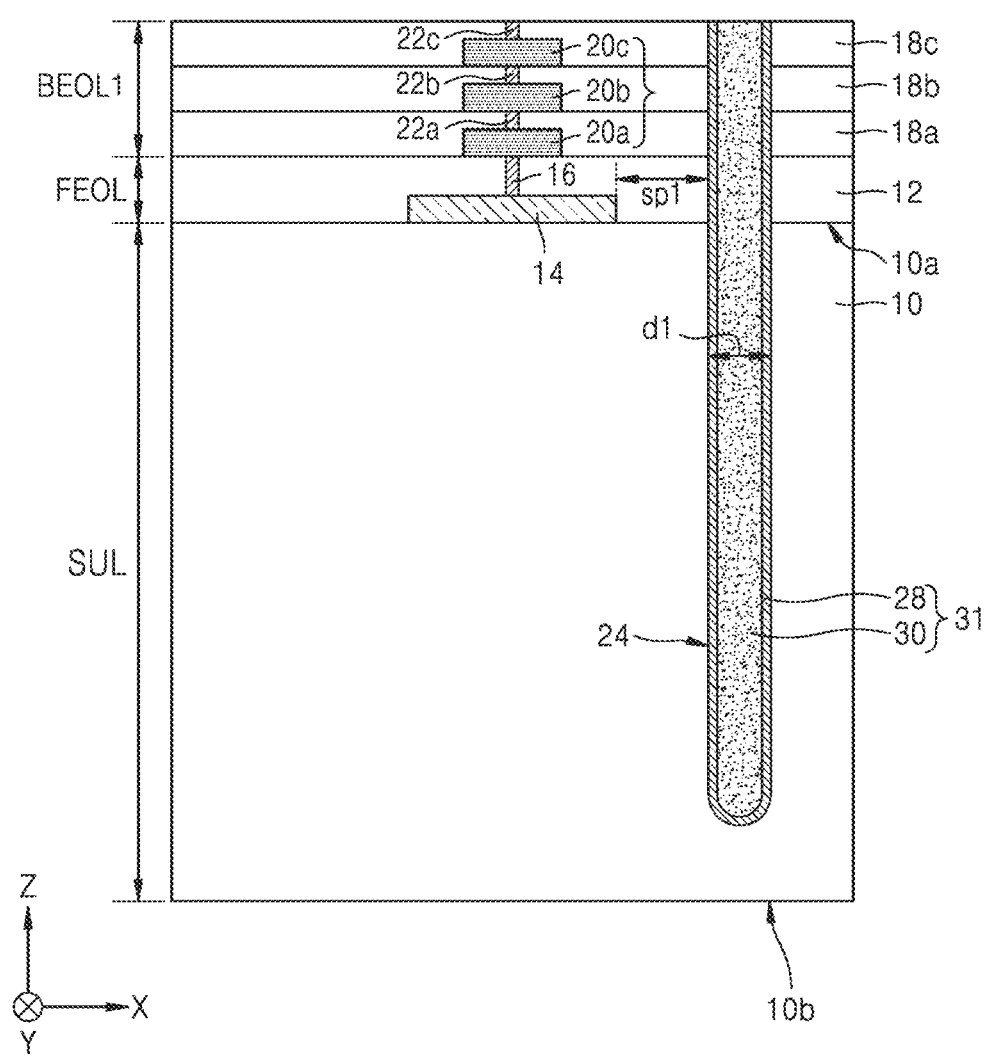

Referring to FIG. 14, a first via insulation layer 28 may be formed on an inner wall of the first via hole 24. The first via insulation layer 28 may include a silicon oxide layer or a silicon nitride layer. Subsequently, a first via electrode 30 burying (e.g., filling) the first via hole 24 may be formed on the first via insulation layer 28.

The first via electrode 30, as described above with reference to FIG. 2, may include a first via barrier layer (30a of FIG. 2) and a first via metal layer (30b of FIG. 2). The first via electrode 30 may include a metal layer (e.g., a copper layer, an aluminum layer, or a tungsten layer). Through such a manufacturing process, a first through via structure 31 including the first via insulation layer 28 and the first via electrode 30 may be formed.

Figure 15:
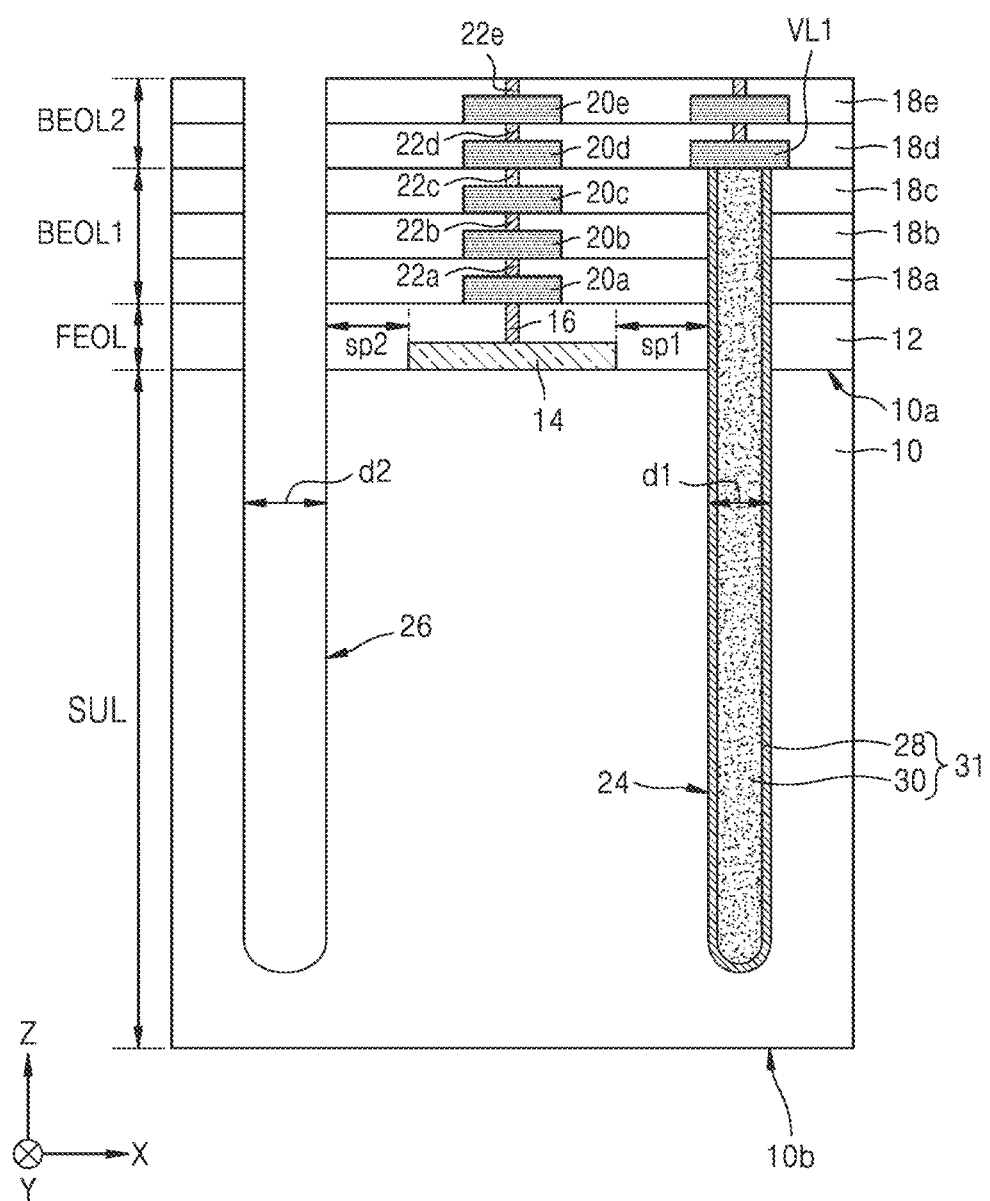

Referring to FIG. 15, a second back end level layer BEOL2 may be formed on the first back end level layer BEOL1. The second back end level layer BEOL2 may include fourth and fifth metal wiring layers 20d and 20e, fourth and fifth wiring insulation layers 18d and 18e, and fourth and fifth wiring via layers 22d and 22e. The fourth wiring via layer 22d may electrically connect the fourth metal wiring layer 20d to the fifth metal wiring layer 20e. The fourth metal wiring layer 20d may be electrically connected to the third wiring via layer 22c.

The fourth and fifth metal wiring layers 20d and 20e may each include a metal layer (e.g., a copper layer, an aluminum layer, or a tungsten layer). The fourth and fifth wiring insulation layers 18d and 18e may each include a silicon oxide layer. The fourth and fifth wiring via layers 22d and 22e may each include a metal layer (e.g., a copper layer, an aluminum layer, or a tungsten layer).

The fourth metal wiring layer 20d formed on the first through via structure 31, among the fourth and fifth metal wiring layers 20d and 20e configuring the second back end level layer BEOL2, may be a first via connection metal wiring layer VL1. The first via connection metal wiring layer VL1 may be electrically connected to the first through via structure 31.

Subsequently, a second via hole 26 may be formed by selectively etching the first to fifth wiring insulation layers 18a to 18e, the interlayer insulation layer 12, and the semiconductor substrate 10. The second via hole 26 may be formed in the first to fifth wiring insulation layers 18a to 18e, the interlayer insulation layer 12, and the semiconductor substrate 10. The second via hole 26 may be formed by using a photolithography process. The second via hole 26 may be formed to have a second diameter d2, which is greater than the first diameter d1. The second via hole 26 may be formed apart from another side (e.g., an opposite side) of the integrated circuit layer 14 by a second separation distance sp2. The second via hole 26 may be referred to as a second via trench.

Figure 16:
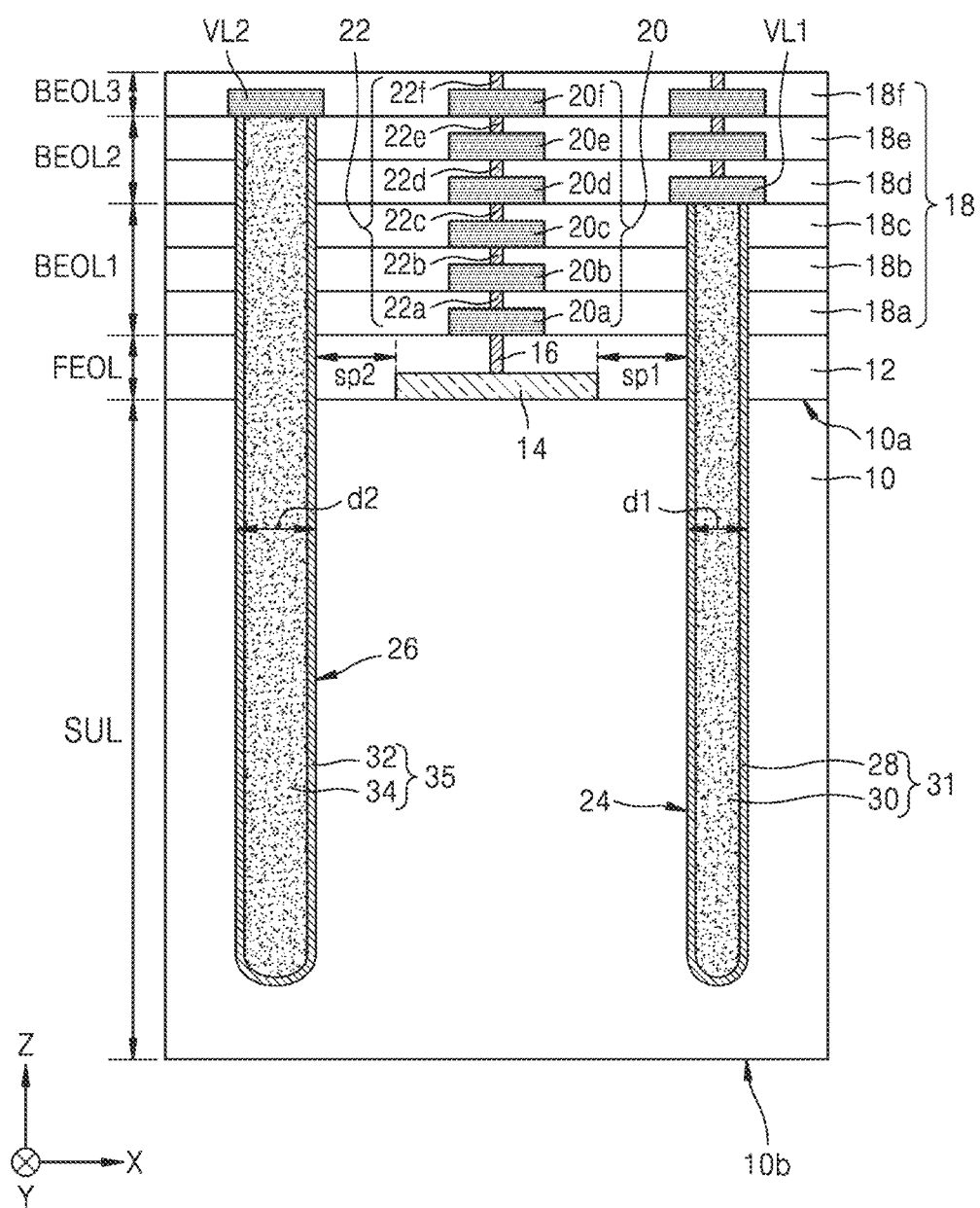

Referring to FIG. 16, a second via insulation layer 32 may be formed on an inner wall of the second via hole 26. The second via insulation layer 32 may include a silicon oxide layer or a silicon nitride layer. Subsequently, a second via electrode 34 burying (e.g., filling) the second via hole 26 may be formed on the second via insulation layer 32.

The second via electrode 34 may include a metal layer (e.g., a copper layer, an aluminum layer, or a tungsten layer). Through such a manufacturing process, a second through via structure 35 including the second via insulation layer 32 and the second via electrode 34 may be formed.

Subsequently, a third back end level layer BEOL3 may be formed on the second back end level layer BEOL2. The third back end level layer BEOL3 may include a sixth metal wiring layer 20f, a sixth wiring insulation layer 18f, and a sixth wiring via layer 22f. The sixth metal wiring layer 20f may be electrically connected to the fifth wiring via layer 22e.

The sixth metal wiring layer 20f may include a metal layer (e.g., a copper layer, an aluminum layer, or a tungsten layer). The sixth wiring insulation layer 18f may include a silicon oxide layer. The sixth wiring via layer 22f may include a metal layer (e.g., a copper layer, an aluminum layer, or a tungsten layer).

The sixth metal wiring layer 20f formed on the second through via structure 35 may be a second via connection metal wiring layer VL2. The second via connection metal wiring layer VL2 may be electrically connected to the second through via structure 35.

Through such a manufacturing process, the back end level layer BEOL may include the first back end level layer BEOL1, the second back end level layer BEOL2, and the third back end level layer BEOL3. The back end level layer BEOL may include a plurality of metal wiring layers 20, a plurality of wiring insulation layers 18, and a plurality of wiring via layers 22. The metal wiring layers 20 may include first to sixth metal wiring layers 20a to 20f. The wiring insulation layers 18 may include first to sixth wiring insulation layers 18a to 18f. The wiring via layers 22 may include first to sixth wiring via layers 22a to 22f.

Subsequently, as illustrated in FIG. 1, an upper pad (33 of FIG. 1) may be formed on the sixth wiring via layer 22f. According to some example embodiments, as illustrated in FIG. 1, a chemical mechanical polishing process may be performed on the second surface 10b of the semiconductor substrate 10 to expose the first through via structure 31 and the second through via structure 35 and to form a lower protection layer 46 and a lower pad 48.

Figure 17:
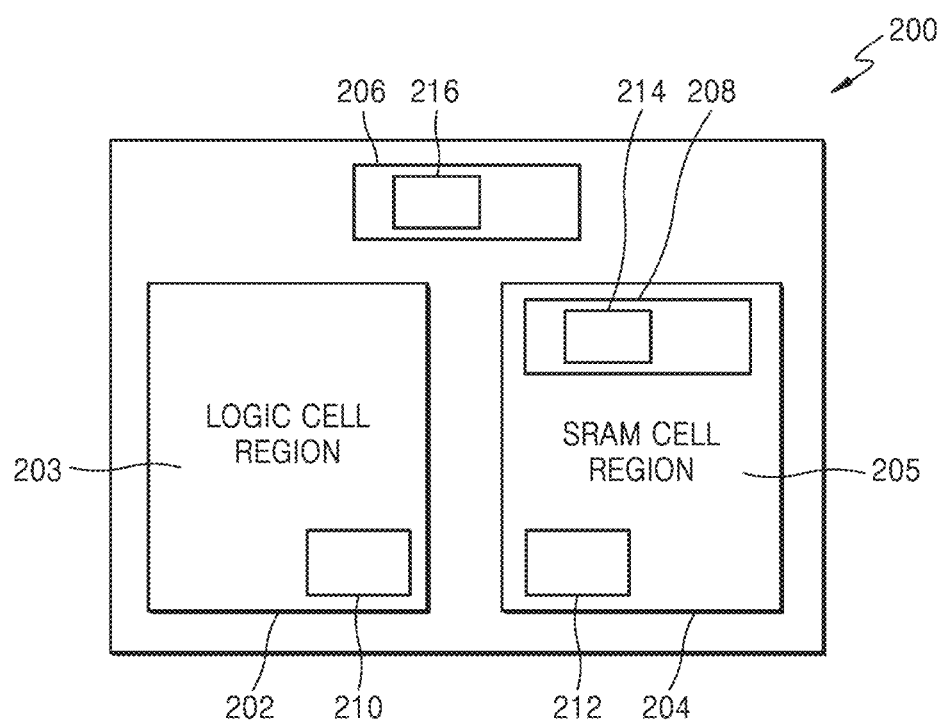
FIG. 17 is a block diagram illustrating a configuration of a semiconductor chip including a semiconductor device according to an example embodiment.

FIG. 17 is a block diagram illustrating a configuration of a semiconductor chip 200 including a semiconductor device according to an example embodiment.

For example, the semiconductor chip 200 may include a logic region 202, an SRAM region 204, and an input/output (I/O) region 206. The semiconductor chip 200 may include the semiconductor devices 1 to 6 according to embodiments. The logic region 202 may include a logic cell region 203. The SRAM region 204 may include an SRAM cell region 205 and an SRAM peripheral circuit region 208.

A first transistor 210 may be disposed in the logic cell region 203, and a second transistor 212 may be disposed in the SRAM cell region 205. A third transistor 214 may be formed in the SRAM peripheral circuit region 208, and a fourth transistor 216 may be disposed in the I/O region 206.

Figure 18:
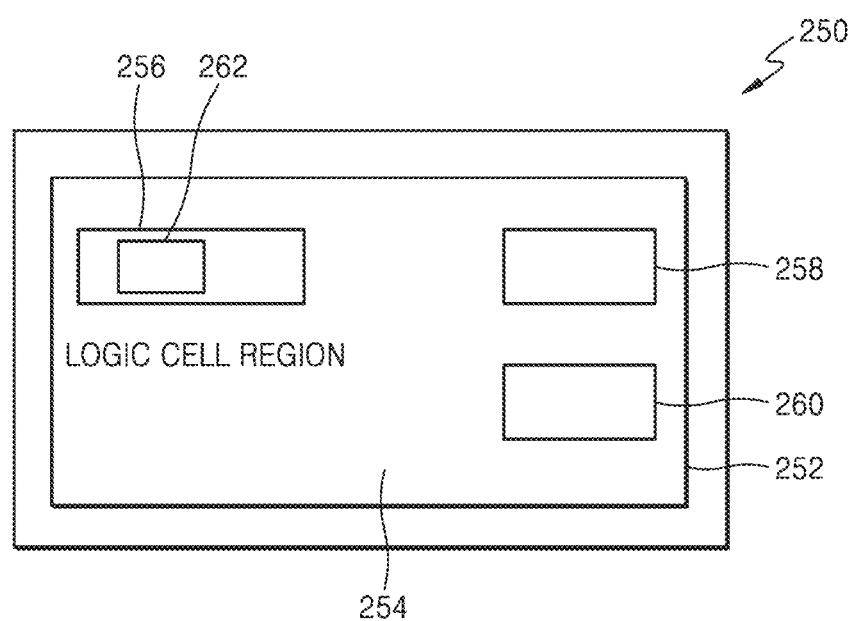
FIG. 18 is a block diagram illustrating a configuration of a semiconductor chip including a semiconductor device according to an example embodiment.

FIG. 18 is a block diagram illustrating a configuration of a semiconductor chip 250 including a semiconductor device according to an example embodiment.

For example, the semiconductor chip 250 may include a logic region 252. The semiconductor chip 250 may include the semiconductor devices 1 to 6 according to embodiments. The logic region 252 may include a logic cell region 254 and an I/O region 256. A first transistor 258 and a second transistor 260 may be disposed in the logic cell region 254. The first transistor 258 and the second transistor 260 may be transistors having different conductive types. A third transistor 262 may be disposed in the I/O region 256.

Figure 19:
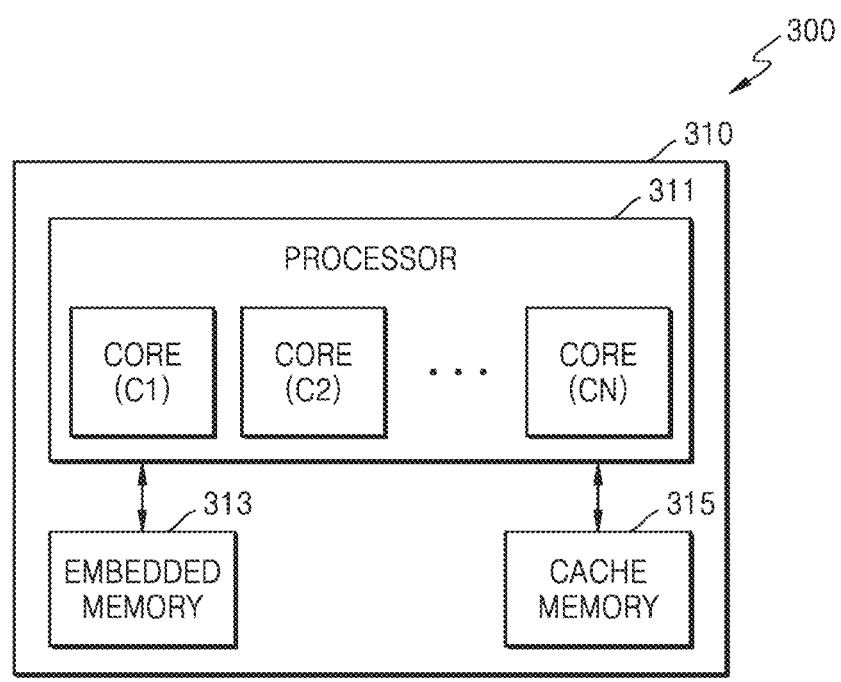
FIG. 19 is a block diagram illustrating a configuration of a semiconductor package including a semiconductor device according to an example embodiment.
Figure 20:
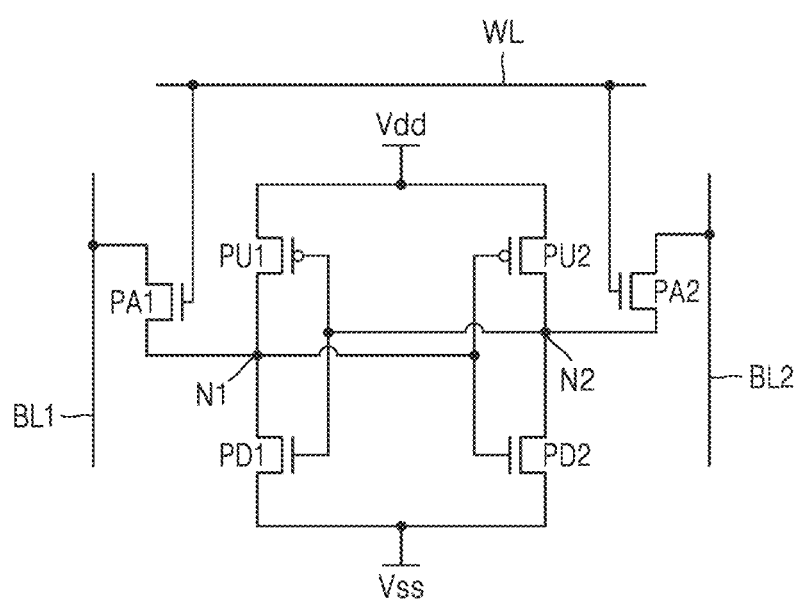
FIG. 20 is an equivalent circuit diagram of a static random access memory (SRAM) cell included in a semiconductor device according to an example embodiment.

FIG. 19 is a block diagram illustrating a configuration of a semiconductor package 300 including a semiconductor device according to an example embodiment, and FIG. 20 is an equivalent circuit diagram of an SRAM cell included in a semiconductor device according to an example embodiment.

Referring to FIG. 19, the semiconductor package 300 may include a system-on chip 310. The system-on chip 310 may include a processor 311, an embedded memory 313, and a cache memory 315. The processor 311 may include one or more processor cores C1 to CN. The processor cores C1 to CN may process data and a signal. The processor cores C1 to CN may include the semiconductor devices 1 to 6 according to an example embodiment.

The semiconductor package 300 may perform a unique function by using the processed data and signal. For example, the processor 311 may include an application processor. The embedded memory 313 may exchange first data DATA1 with the processor 311. The first data DATA1 may be data that is obtained through processing by the processor cores C1 to CN or is to be processed by the processor cores C1 to CN. The embedded memory 313 may manage the first data DATA1. For example, the embedded memory 313 may buffer the first data DATA1. The embedded memory 313 may operate as a buffer memory or a working memory of the processor 311.

The embedded memory 313 may include SRAM. The SRAM may operate at a speed which is higher than DRAM. When the SRAM is embedded into the system-on chip 310, the semiconductor package 300 may be implemented to have a small size and operate at a high speed. Furthermore, when the SRAM is embedded into the system-on chip 310, the amount of consumption of active power of the semiconductor package 300 may be reduced.

For example, the SRAM may include the semiconductor devices 1 to 6 according to embodiments. The cache memory 315 may be mounted on the system-on chip 310 along with the processor cores Cl to CN. The cache memory 315 may store cache data DATc. The cache data DATc may be data used by the processor cores C1 to Cn. The cache memory 315 may have a small storage capacity, but may operate at a very high speed.

For example, the cache memory 315 may include SRAM including the semiconductor devices 1 to 6 according to embodiments. When the cache memory 315 is used, the number of times the processor 311 accesses the embedded memory 313 and a time for accessing the embedded memory 313 may decrease. Therefore, when the cache memory 315 is used, an operation speed of the semiconductor package 300 may increase. To help understanding, the cache memory 315 is illustrated as an element provided independently from the processor 311. However, the cache memory 315 may be configured to be included in the processor 311.

Referring to FIG. 20, an SRAM cell may be implemented with the semiconductor devices 1 to 6 according to an example embodiment. For example, the SRAM cell may be applied to the embedded memory 313 and/or the cache memory 315 described above with reference to FIG. 19. The SRAM cell may include a first pull-up transistor PU1, a first pull-down transistor PD1, a second pull-up transistor PU2, a second pull-down transistor PD2, a first access transistor PA1, and a second access transistor PA2.

The first and second pull-up transistors PU1 and PU2 may each include a PMOS transistor, and the first and second pull-down transistors PD1 and PD2 and the first and access transistors PA1 and PA2 may each include an NMOS transistor. The first pull-up transistor PU1 and the first pull-down transistor PD1 may each be configured with a first inverter. Gate electrodes (gates), connected to each other, of the first pull-up transistor PU1 and the first pull-down transistor PD1 may each correspond to an input terminal of the first inverter, and a first node N1 may correspond to an outer terminal of the first inverter.

The second pull-up transistor PU2 and the second pull-down transistor PD2 may each be configured with a second inverter. Gate electrodes (gates), connected to each other, of the second pull-up transistor PU2 and the second pull-down transistor PD2 may each correspond to an input terminal of the second inverter, and a second node N2 may correspond to an outer terminal of the second inverter.

The first and second inverters may be coupled to each other to configure a latch structure. The gate electrodes of the first pull-up transistor PU1 and the first pull-down transistor PD1 may be electrically connected to the second node N2, and the gates of the second pull-up transistor PU2 and the second pull-down transistor PD2 may be electrically connected to the first node N1.

A first source/drain of the first access transistor PA1 may be connected to the first node N1, and a second source/drain of the first access transistor PA1 may be connected to a first bit line BL1. A first source/drain of the second access transistor PA2 may be connected to the second node N2, and a second source/drain of the second access transistor PA2 may be connected to a second bit line BL2.

Gate electrodes of the first and second access transistors PA1 and PA2 may each be electrically connected to a word line WL. Therefore, the SRAM cell may be implemented with the semiconductor devices 1 to 6 according to some example embodiments.

Figure 21:
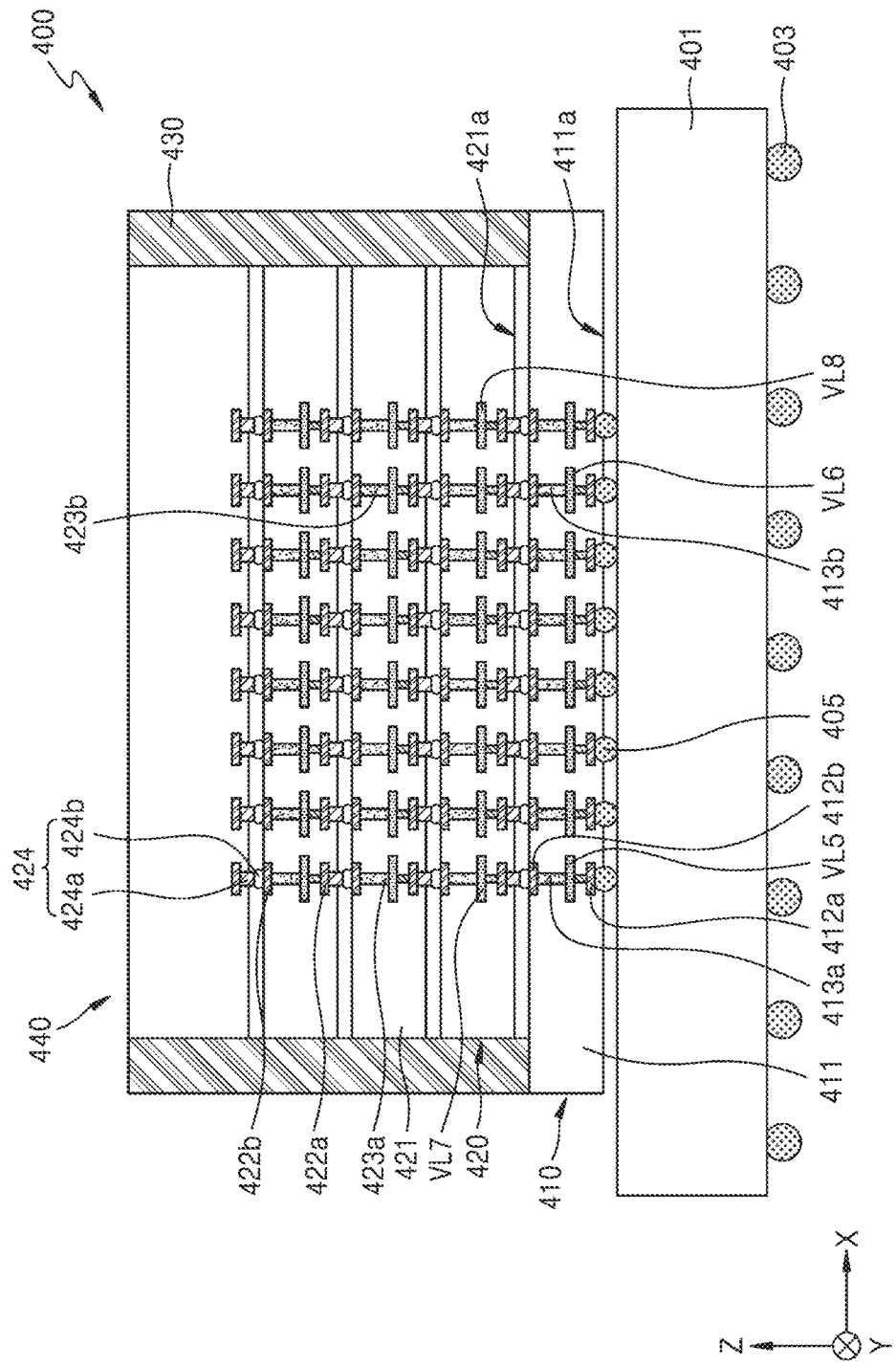
FIG. 21 is a cross-sectional view illustrating a semiconductor package including a semiconductor device according to an example embodiment.

FIG. 21 is a cross-sectional view illustrating a semiconductor package 400 including a semiconductor device according to an example embodiment.

For example, the semiconductor package 400 may include a stack semiconductor chip 440 stacked on a package substrate 401. The package substrate 401 may include a printed circuit board (PCB). A solder bump 403, which is an external connection terminal, may be formed on a bottom surface of the package substrate 401.

The stack semiconductor chip 440 may include a first semiconductor chip 410 and a plurality of second semiconductor chips 420 mounted on the first semiconductor chip 410. The second semiconductor chips 420 may be sequentially stacked on the first semiconductor chip 410 in a vertical direction (a Z direction). A width of the first semiconductor chip 410 may be greater than that of each of the second semiconductor chips 420.

In the drawing, the stack semiconductor chip 440 is illustrated as including four second semiconductor chips 420, but example embodiments are not limited thereto. For example, the stack semiconductor chip 440 may include two or more second semiconductor chips 420. The first semiconductor chip 410 and the second semiconductor chips 420 may include the semiconductor devices 1 to 6 according to some example embodiments.

For example, the first semiconductor chip 410 may include a first pad 412a and a second pad 412b on both surfaces of a first semiconductor substrate 411. The first pad 412a may be electrically connected to the second pad 412b by using a first through via structure 413a, a first via connection metal wiring layer VLS, a second through via structure 413b, and a second via connection metal wiring layer VL6.

The first through via structure 413a may be electrically connected to the first via connection metal wiring layer VLS.

The second through via structure 413b may be electrically connected to the second via connection metal wiring layer VL6. In the drawing, for convenience, it is illustrated that a horizontal level of the first via connection metal wiring layer VL5 is the same as that of the second via connection metal wiring layer VL6.

The first pad 412a may be electrically connected to the package substrate 401 by using the solder bump 405, which is the external connection terminal. An active surface 411a may be disposed under the first semiconductor chip 410. The first pad 412a may be a top pad. The second pad 412b may be a bottom pad.

Each of the second semiconductor chips 420 may include a third pad 422a and a fourth pad 422b on both surfaces of a second semiconductor substrate 412. The third pad 422a may be electrically connected to the fourth pad 422b by using a third through via structure 423a, a third via connection metal wiring layer VL7, a fourth through via structure 423b, and a fourth via connection metal wiring layer VL8.

The third through via structure 423a may be electrically connected to the third via connection metal wiring layer VL7. The fourth through via structure 423b may be electrically connected to the fourth via connection metal wiring layer VL8. In the drawing, for convenience, it is illustrated that a horizontal level of the third via connection metal wiring layer VL7 is the same as that of the fourth via connection metal wiring layer VL8.

The third pad 422a may be electrically connected to the second semiconductor chips 420 by using an internal connection terminal 424. The internal connection terminal 424 may include an internal connection pad 424a and an internal bump 424b.

An active surface 421a may be disposed under each of the second semiconductor chips 420. The third pad 422a may be a top pad. The fourth pad 422b may be a bottom pad. The stack semiconductor chip 440 may be bonded to the second semiconductor chips 420 by an adhesive layer 435. The second semiconductor chips 420 may be molded by a molding layer 430 on the first semiconductor chip 410.

Figure 22:
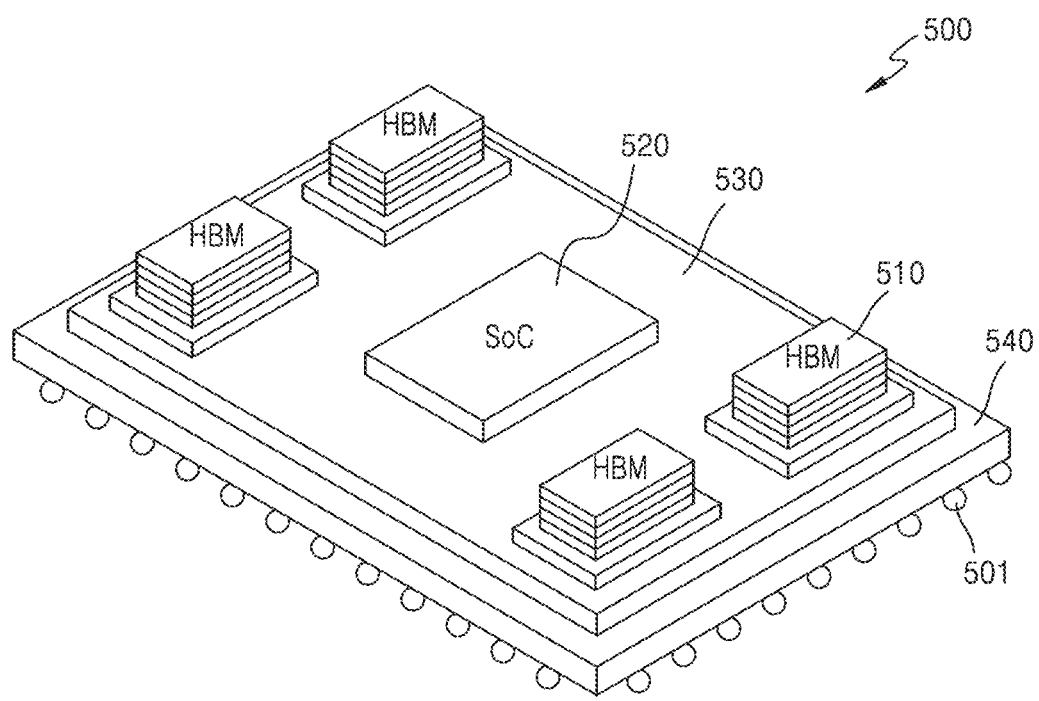
FIGS. 22 and 23 are diagrams illustrating a semiconductor package according to some example embodiments.
Figure 23:
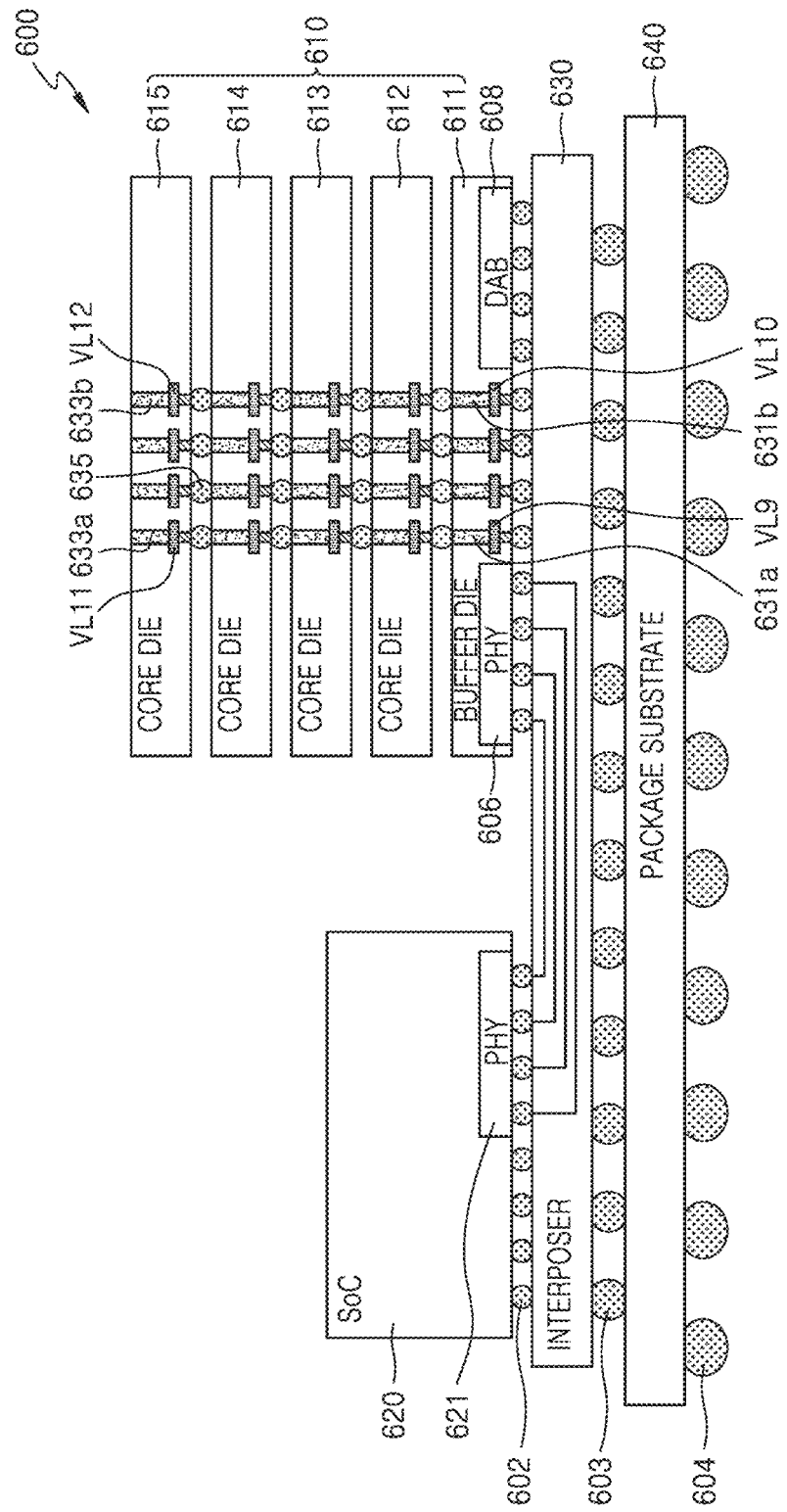

FIGS. 22 and 23 are diagrams illustrating a semiconductor package 500 according to some example embodiments.

Referring to FIG. 22, the semiconductor package 500 may include a plurality of stack type memory devices 510 and a system-on chip (SoC) 520. The stack type memory devices 510 and the SoC 520 may be stacked on an interposer 530, and the interposer 530 may be stacked on a package substrate 540. The semiconductor package 500 may transfer or receive signals to or from an external package or electronic devices through a solder ball 501 attached on a lower portion of the package substrate 540.

Each of the stack type memory devices 510 may be implemented based on high bandwidth memory (HBM) standard. However, the inventive concepts are not limited thereto, and each of the stack type memory devices 510 may be implemented based on graphics double data rate (GDDR), hardware management console (HMC), or Wide I/O. Each of the stack type memory devices 510 may include the semiconductor devices 1 to 6 according to some example embodiments.

The SoC 520 may include at least one processor, such as a central processing unit (CPU), an application processor (AP), graphics processing unit (GPU), and a neural processing unit (NPU), and a plurality of memory controllers for controlling the plurality of stack type memory devices 510. The SoC 520 may transfer or receive signals to or from a corresponding stack type memory device through a memory controller.

Referring to FIG. 23, a semiconductor package 600 may include a stack type memory device 610, an SoC 620, an interposer 630, and a package substrate 640. The stack type memory device 610 may include a buffer die 611 and a plurality of core dies 612 to 615.

Each of the core dies 612 to 615 may include a plurality of memory cells for storing data. The buffer die 611 may include a physical layer (PHY) 606 and a direct access region (DAB) 608. The physical layer 606 may be electrically connected to the physical layer 621 of the SoC 620 through the interposer 630. The stack type memory device 610 may receive signals from the SoC 620 through the physical layer 606, or may transfer signals to the SoC 620.

The direct access region 608 may provide an access path for testing the stack type memory device 610 without passing through the SoC 620. The direct access region 608 may include a conductive means (for example a port or a pin) for directly communicating with an external test device. A test signal received through the direct access region 608 may be transferred to the core dies 612 to 615 through a plurality of through via structures. Data read from the core dies 612 to 615 so as to test the core dies 612 to 615 may be transferred to the text device through a plurality of through via structures and the direct access region 608. Therefore, a direct access test may be performed on the core dies 612 to 615.

The buffer die 611 and the core dies 612 to 615 may be electrically connected to each other through a plurality of through via structures 631a, 631b, 633a, and 633b and a plurality of bumps 635. The buffer die 611 and the core dies 612 to 615 may include the semiconductor devices 1 to 6 according to some example embodiments.

For example, the buffer die 611 may include a first through via structure 631a, a first via connection metal wiring layer VL9, a second through via structure 631b, and a second via connection metal wiring layer VL10. The first through via structure 631a may be electrically connected to the first via connection metal wiring layer VL9. The second through via structure 631b may be electrically connected to the second via connection metal wiring layer VL10. In the drawing, for convenience, it is illustrated that a horizontal level of the first via connection metal wiring layer VL9 is the same as that of the second via connection metal wiring layer VL10.

Each of the core dies 612 to 615 may include a third through via structure 633a, a third via connection metal wiring layer VL11, a fourth through via structure 633b, and a fourth via connection metal wiring layer VL12. The third through via structure 633a may be electrically connected to the third via connection metal wiring layer VL11. The fourth through via structure 633b may be electrically connected to the fourth via connection metal wiring layer VL12. In the drawing, for convenience, it is illustrated that a horizontal level of the third via connection metal wiring layer VL11 is the same as that of the fourth via connection metal wiring layer VL12.

The buffer die 611 may receive signals, respectively provided to channels through the bumps 602 allocated by channel units, from the SoC 620, or may transfer the signals to the SoC 620 through the bumps 602. For example, the bumps 602 may include micro-bumps.

The SoC 620 may execute a plurality of applications supported by the semiconductor package 600 by using the stack type memory device 610. For example, the SoC 620 may include at least one processor such as a CPU, an AP, a GPU, an NPU, a tensor processing unit (TPU), a vision processing unit (VPU), an image signal processor (ISP), a digital signal processor (DSP) and may execute specialized arithmetic operations.

The SoC 620 may control an overall operation of the stack type memory device 610. The SoC 620 may include the physical layer 621. The physical layer 621 may include an interface circuit for transferring or receiving signals to or from the physical layer 606 of the stack type memory device 610. The SoC 620 may provide various signals to the physical layer 606 through the physical layer 621. The signals provided to the physical layer 606 may be transferred to the core dies 612 to 615 through the through via structures 631*a*, 631*b*, 633*a*, and 633*b* and an interface circuit of the physical layer 606.

The interposer 630 may connect the stack type memory device 610 to the SoC 620. The interposer 630 may connect the physical layer 606 of the stack type memory device 610 to the physical layer 621 of the SoC 620 and may provide physical paths including conductive materials. Therefore, the stack type memory device 610 and the SoC 620 may be stacked on the interposer 630 and may transfer and receive signals therebetween.

The bumps 603 may be attached on an upper portion of the package substrate 640, and the solder ball 604 may be attached on a lower portion of the package substrate 640. For example, the bumps 603 may include flip-chip bumps. The interposer 630 may be stacked on the package substrate 640 through the bumps 603. The semiconductor package 600 may transfer or receive signals to or from an external package or electronic devices through the solder ball 604. For example, the package substrate 640 may include a PCB.

While the inventive concepts have been particularly shown and described with reference to some example embodiments thereof, it will be understood that various changes in form and details may be made therein without departing from the spirit and scope of the following claims.

What is claimed is:

1. A semiconductor device comprising:
a semiconductor substrate;
an integrated circuit layer on the semiconductor substrate;
first to $n^{th}$ metal wiring layers (where n is a positive integer) sequentially stacked on the semiconductor substrate and the integrated circuit layer;
a first through via structure extending in a vertical direction toward the semiconductor substrate from a first via connection metal wiring layer, and passing through the semiconductor substrate, the first via connection metal wiring layer being one of the second to $n^{th}$ metal wiring layers other than the first metal wiring layer; and
a second through via structure being apart from the first through via structure, extending in a vertical direction toward the semiconductor substrate from a second via connection metal wiring layer, and passing through the semiconductor substrate, the second via connection metal wiring layer being one of the second to $n^{th}$ metal wiring layers other than the first metal wiring layer.

2. The semiconductor device of claim 1, wherein a first diameter of the first through via structure differs from a second diameter of the second through via structure.

3. The semiconductor device of claim 1, wherein
a first diameter of the first through via structure is less than a second diameter of the second through via structure,
the first through via structure is apart from one side of the integrated circuit layer by a first separation distance, and
the second through via structure is apart from another side of the integrated circuit layer by a second separation distance, which is less than the first separation distance.

4. The semiconductor device of claim 1, wherein a first diameter of the first through via structure is same as a second diameter of the second through via structure.

5. The semiconductor device of claim 4, wherein
the first through via structure is apart from one side of the integrated circuit layer by a first separation distance, and
the second through via structure is apart from another side of the integrated circuit layer by a second separation distance, which is same as the first separation distance.

6. The semiconductor device of claim 1, wherein the first via connection metal wiring layer and the second via connection metal wiring layer are at different levels from each other.

7. The semiconductor device of claim 1, wherein the first via connection metal wiring layer and the second via connection metal wiring layer are at a same level.

8. The semiconductor device of claim 1, further comprising:
an upper pad on the $n^{th}$ metal wiring layer, which is an uppermost one of the first to $n^{th}$ metal wiring layers, and electrically connected to the $n^{th}$ metal wiring layer; and
a lower pad on a bottom surface of the semiconductor substrate and electrically connected to a corresponding one of the first through via structure or the second through via structure.

9. The semiconductor device of claim 1, further comprising:
a redistribution layer on the $n^{th}$ metal wiring layer, which is an uppermost one of the first to $n^{th}$ metal wiring layers, and electrically connected to the $n^{th}$ metal wiring layer;
a bump pad on the redistribution layer and electrically connected to the redistribution layer; and
a solder bump on the bump pad.

10. A semiconductor device comprising:
a semiconductor substrate including a first surface and a second surface opposite to the first surface;
a front end level layer on the first surface of the semiconductor substrate, the front end level layer including an integrated circuit layer;
a back end level layer on the front end level layer, the back end level layer including first to $n^{th}$ metal wiring layers (where n is a positive integer) sequentially stacked on the integrated circuit layer and electrically connected to the integrated circuit layer;
a first through via structure extending in a vertical direction toward the semiconductor substrate from a first via connection metal wiring layer, and passing through the back end level layer, the front end level layer, and a region between the first surface and the second surface of the semiconductor substrate, the first via connection metal wiring layer being one of the second to $n^{th}$ metal wiring layers other than the first metal wiring layer; and
a second through via structure being apart from the first through via structure, extending in a vertical direction toward the semiconductor substrate from a second via connection metal wiring layer, and passing through the back end level layer, the front end level layer, and the region between the first surface and the second surface of the semiconductor substrate, the second via connection metal wiring layer being one of the second to $n^{th}$ metal wiring layers other than the first metal wiring layer.

11. The semiconductor device of claim 10, wherein the integrated circuit layer configuring the front end level layer comprises a transistor, a capacitor, or a register.

12. The semiconductor device of claim 10, wherein the back end level layer comprises:
a plurality of wiring insulation layers configured to insulate the first to $n^{th}$ metal wiring layers from each other; and
a plurality of wiring via layers in the plurality of wiring insulation layers and configured to connect the first to $n^{th}$ metal wiring layers.

13. The semiconductor device of claim 10, wherein each of the first through via structure and the second through via structure comprises:
a via hole in the back end level layer, the front end level layer, and the semiconductor substrate;
a via insulation layer on an inner wall of the via hole; and
a via electrode on the via insulation layer and filling the via hole.

14. The semiconductor device of claim 10, wherein a first height of the first through via structure differs from a second height of the second through via structure.

15. The semiconductor device of claim 10, wherein a first diameter of the first through via structure differs from a second diameter of the second through via structure.

16. The semiconductor device of claim 10, wherein
a second diameter of the second through via structure is greater than a first diameter of the first through via structure,
the second through via structure comprises a power transfer via structure, and
the first through via structure comprises a signal transfer via structure.

17. A semiconductor device comprising:
a semiconductor substrate;
a front end level layer on the semiconductor substrate, the front end level layer including an integrated circuit layer, an interlayer insulation layer configured to insulate the integrated circuit layer, and a contact plug layer in the interlayer insulation layer and electrically connected to the integrated circuit layer;
a back end level layer on the front end level layer, the back end level layer including first to $n^{th}$ metal wiring layers (where n is a positive integer) sequentially stacked on the front end level layer and electrically connected to the integrated circuit layer, a plurality of wiring insulation layers configured to insulate the first to $n^{th}$ metal wiring layers from each other, and a plurality of wiring via layers in the plurality of wiring insulation layers and configured to connect the first to $n^{th}$ metal wiring layers;
a first through via structure extending in a vertical direction toward the semiconductor substrate from a first via connection metal wiring layer, and passing through the plurality of wiring insulation layers, the interlayer insulation layer, and the semiconductor substrate, the first via connection metal wiring layer being one of the second to $n^{th}$ metal wiring layers other than the first metal wiring layer; and
a second through via structure being apart from the first through via structure, extending in a vertical direction toward the semiconductor substrate from a second via connection metal wiring layer, and passing through the plurality of wiring insulation layers, the interlayer insulation layer, and the semiconductor substrate, the second via connection metal wiring layer being one of the second to $n^{th}$ metal wiring layers other than the first metal wiring layer,
wherein the first through via structure is in a first keep-out zone at one side of the integrated circuit layer, and the second through via structure is in a second keep-out zone at an other side of the integrated circuit layer.

18. The semiconductor device of claim 17, wherein each of the first keep-out zone and the second keep-out zone comprises an insulation layer.

19. The semiconductor device of claim 17, wherein
a second diameter of the second through via structure is greater than a first diameter of the first through via structure,
the first through via structure is apart from one side of the integrated circuit layer by a first separation distance, and
the second through via structure is apart from another side of the integrated circuit layer by a second separation distance, which is less than the first separation distance.

20. The semiconductor device of claim 17, wherein the first via connection metal wiring layer and the second via connection metal wiring layer are at different levels from each other, in the back end level layer.

* * * * *